United States Patent

Birbaum et al.

[11] Patent Number: 6,057,380
[45] Date of Patent: May 2, 2000

[54] PHOTOGENERATION OF AMINES FROM α-AMINOACETOPHENONES

[75] Inventors: Jean-Luc Birbaum, Kobe, Japan; Martin Kunz, Efringen-Kirchen, Germany; Akira Kimura, Hyogo, Japan; Hisatoshi Kura, Hyogo, Japan; Hidetaka Oka, Hyogo, Japan; Hiroko Nakashima, Toyonaka, Japan

[73] Assignee: Ciba Specialty Chemicals Corporation, Tarrytown, N.Y.

[21] Appl. No.: 08/985,984

[22] Filed: Dec. 5, 1997

[30] Foreign Application Priority Data

Aug. 22, 1997 [EP] European Pat. Off. ............ 97810593

[51] Int. Cl.$^7$ .......................... G03C 1/735; C08F 2/46; C08L 63/00; C08G 59/16

[52] U.S. Cl. ................ 522/8; 522/14; 522/33; 522/34; 522/36; 522/39; 522/129; 522/146; 522/170; 430/280.1

[58] Field of Search .................... 522/8, 14, 39, 522/36, 34, 170, 129, 146; 430/280.1

[56] References Cited

U.S. PATENT DOCUMENTS

| | | | |
|---|---|---|---|
| 4,582,862 | 4/1986 | Berner et al. | 522/14 |
| 4,943,516 | 7/1990 | Kamayachi et al. | 430/280 |
| 4,992,547 | 2/1991 | Berner et al. | 544/162 |
| 5,077,402 | 12/1991 | Desobry et al. | 544/87 |

FOREIGN PATENT DOCUMENTS

| | | |
|---|---|---|
| 2301826 | 12/1996 | United Kingdom . |
| 96/20919 | 7/1996 | WIPO . |

OTHER PUBLICATIONS

Patant Abstracts of Japan 4366112 (1992).

*Primary Examiner*—Susan W. Berman
*Attorney, Agent, or Firm*—Luther A. R. Hall

[57] ABSTRACT

Compounds of formula I, II or III

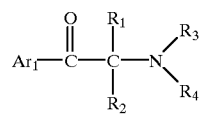
(I)

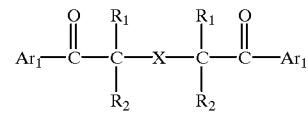

(II)

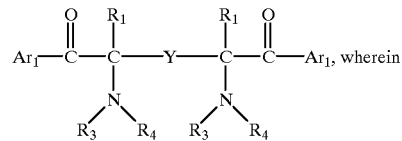

(III)

X is a divalent radical;

Y is $C_1$–$C_6$ aklylene, cyclohexylene or a direct bond;

$Ar_1$ is an aromatic radical as defined in claim 1, $R_1$ and $R_2$ are each independently the other, inter alia, a radical of formula

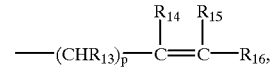

in which p is zero or 1, or a radical of formula

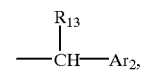

$R_3$ is, inter alia, hydrogen, $C_1$–$C_{12}$alkyl, $C_5$–$C_{12}$cycloalkyl or phenyl-$C_1$–$C_3$alkyl;

$R_4$ is, inter alia, $C_1$–$C_{12}$cycloalkyl, phenyl-$C_1$–$C_3$alkyl or phenyl;

or an acid addition salt of a compound of formula I, II or III;

are useful as photosensitive base catalysts in base crosslinking compositions.

7 Claims, No Drawings

PHOTOGENERATION OF AMINES FROM α-AMINOACETOPHENONES

The application is directed to base-catalysed curable compositions comprising α-aminoketone compounds as latent bases, as well as to a process for curing such compositions, inter alia in combination with radically polymerizable components.

Among thermosetting resins epoxy resins have found extremely wide applications due to the variety of chemical reactions and materials that can be used for curing and the many different properties that result. More specifically, their excellent mechanical and chemical properties, high adhesive strength, good heat resistance and high electrical resistance have made them extremely useful. They are widely used in such applications as adhesives, coatings, thermosets or photoresists (see for example C. A. May, Epoxy Resins, Chemistry and Technology, 2nd Ed. Marcel Dekker, New York, 1988).

Curing of epoxy resins can be affected by polyaddition reactions which result in coupling as well as crosslinking. The most widely used agents for that purpose are active hydrogen compounds such as polyamides, polyacids, polymercaptans, polyphenols, anhydrides, isocyanates etc. These reactions are in principle stoichiometric reactions between an active hydrogen in the curing agent and an epoxide group, so that the curing agent is usually present in relatively high concentrations. These polyaddition reactions can of course be catalyzed by appropriate catalysts. It is possible to use, for example, dicyandiamide, benzoguanamine or imidazol derivatives as catalysts for the reaction of epoxides with carboxylic acids.

Anionic and cationic polymerization of epoxides occurs with a variety of Lewis bases and acids as well as with numerous salts and complex initiators. In the case of base catalysed polymerization, amines such as benzyldimethylamine, or 2,4,6-tris(dimethylaminomethyl) phenol and imidazole derivatives are the most useful initiators. Secondary amines, such as piperidine, diethanolamine and imidazole derivatives, which first undergo addition to the epoxy group via their labile hydrogens and then function as initiators, have also been used. In the case of cationic polymerization, strong Bronsted acids, such as trifluoromethane sulfonic acid, and a wide variety of Lewis acids, the most useful of which are boron trifluoride complexes, can catalyze the cationic polymerization of epoxides.

The unique property of the epoxides can be used in photoimaging applications if suitable photosensitive compositions are available. In principle, epoxides cannot be cured by typical free-radical chemistry, and, they can therefore only be used in radical photopolymerization systems if suitable reactive groups such as vinyl ethers or acrylates are also present. This is not always desirable. Photochemically initiated reactions of epoxy groups require photoinitiators which can generate the appropriate initiating species. Cationic photoinitiators of the onium type, for instance diaryliodonium salts or triarylsulfonium salts, are well known and can be used for the photoinitiated cationic polymerization of epoxides. Although the cationic photopolymerization mechanism has real advantages such as insensitivity to oxygen, it cannot be used if basic materials are present in the UV-curable formulations. Therefore, there is a need for efficient photogenerated base catalysts which can be used for curing epoxy-containing photosensitive compositions. The purpose of the present invention is, first, to provide a new process for photochemically generating tertiary amine catalysts which can be used for the basic catalysis of polyadditions to epoxides and, second, corresponding compositions.

Photogenerated base catalysts are already known in the art (e.g. Pure and Appl. Chem. 1992, 64, 1239), and have been applied to photoresist technology (e.g. EP-A 599 571, JP-A 4330444 and EP-A 555 749). Amines are the most useful photogenerated bases known to date. However, some known photogenerators of amines, such as substituted benzylcarbamates (examples are disclosed in J. Org. Chem. 1990, 55, 5919) suffer from an insufficient absorption in the near UV region, which is a severe restriction for many applications. Although photocatalyts generating amines with higher absorption in the region between 300 and 400 nm have been proposed, see for example Polym. Mat. Sci. Eng. 1991, 64, 55 or Macromol. 1995, 28, 365, they cannot always be used, because recombination of the free amine and the carbonyl by-product to form an imine can occur depending on the acidity of the formulation. Moreover, they can only generate primary or secondary amines, which are not very efficient catalysts for polyadditions to epoxides or for epoxide anionic polymerization.

It is well known that tertiary amines are efficient base catalysts which can be used in reactions of epoxides, but few attempts for generating them photochemically have been described. Photolysis of tetraalkyl ammonium salts has been proposed as a method of generating tertiary amines photochemically (Polym. Mat. Sci. Eng. 1995, 72, 201). These compounds require long irradiation times, have an unfavourable absorption spectrum and their structure can only be varied with difficulty. Accordingly, there is a need for efficient photogenerators of tertiary amines. In order to be useful, such compounds must exhibit low reactivity with the formulation before exposure to UV light. In particular, the storage stability of photosensitive compositions containing them should be high, and they should not become less developable after the predrying step which is usually necessary to remove the solvent. They should have a high absorption in the near UV region in order to generate the free amine efficiently under exposure conditions commonly used in the photoimaging industry: Finally, after irradiation, the generated base should show high catalytic activity in the thermal curing reaction.

The photolytic cleavage of specific α-aminoketone compounds in radicals and the photopolymerization process for olefinically unsaturated monomers and oligomers employing said ketone compounds is known and disclosed, inter alia, in U.S. Pat. Nos. 4,582,862, 4,992,547 and 5,077,042.

European Patent Application 555 749 discloses the use of latent bases in hybrid systems, i.e. systems with radically and cationically polymerizable components. U.S. Pat. No. 4,943,516 discloses hybrid systems comprising a photoinitiator for the radically polymerizable components and inter alia a curing agent for the epoxy component, as well as a process for curing such compositions. (4-methylthiobenzoyl)-1-methyl-1-morpholino-ethane is named as an example of a photoinitiator for the free radically polymerizable components.

It has now been found that specific compounds, already known as initiators for the photocuring of radically polymerizable compositions, are also suitable as base-generating compounds, i.e. as compounds which generate bases upon irradiation ("photobase generators") and thus can be employed in base catalysed reactions.

Accordingly this invention relates to a composition, comprising
(A) as latent base catalyst, at least one compound of formula I, II or III

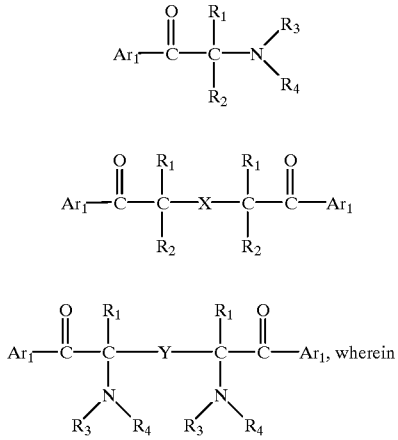

Ar$_1$ is an aromatic radical of formula IV, V, VI or VII

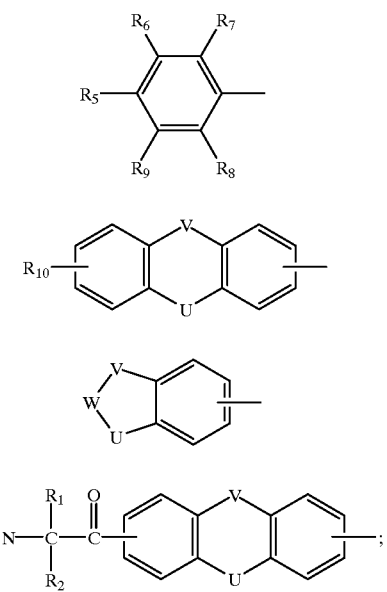

X is a divalent radical of formula

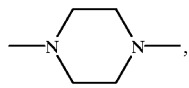

—N(R$_{11}$)— or —N(R$_{11}$)—R$_{12}$—N(R$_{11}$)—;
Y is C$_1$–C$_6$alkylene, cyclohexylene or a direct bond;
U is —O—, —S— or —N(R$_{17}$)—;
V has one of the meanings of U or is —CO—, —CH$_2$—, —CH$_2$CH$_2$—, C$_2$–C$_6$alkylidene or a direct bond;
W is unbranched or branched C$_1$–C$_7$alkylene or C$_2$–C$_6$alkylidene;
R$_1$ and R$_2$ are each independently of one another
(a) C$_1$–C$_{12}$alkyl, which is unsubstituted or substituted by OH, C$_1$–C$_4$alkoxy, SH, CN, —COO(C$_1$–C$_8$alkyl), (C$_1$–C$_4$alkyl)—COO—, phenoxy, halogen or phenyl, or are cyclopentyl or cyclohexyl
(b) a radical of formula $$—(CHR_{13})_p—\underset{R_{14}}{\overset{R_{14}}{C}}=\underset{}{\overset{R_{15}}{C}}—R_{16},$$

in which p is zero or 1, or
(c) a radical of formula

[structure with (CH$_2$)$_q$]

in which q is 0, 1, 2 or 3, or
(d) a radical of formula $$—\underset{}{\overset{R_{13}}{CH}}—Ar_2,$$

(e) phenyl which is unsubstituted or substituted by halogen, C$_1$–C$_{12}$alkyl or C$_1$–C$_{12}$alkoxy,
(f) R$_1$ and R$_2$ together are unbranched or branched C$_2$–C$_9$alkylene or C$_3$–C$_9$oxaalkylene, or form a radical of formula

[two cyclic structures with R$_{14}$, R$_{15}$ and (CH$_2$)$_m$]

Ar$_2$ is a phenyl, naphthyl, thienyl or furyl radical, each of which is unsubstituted or substituted by halogen, OH, C$_1$–C$_{12}$alkyl, or is substituted by C$_1$–C$_4$alkyl, which is substituted by OH, halogen, C$_1$–C$_{12}$alkoxy, —COO(C$_1$–C$_{18}$alkyl), —CO(OCH$_2$CH$_2$)$_n$OCH$_3$ or —OCO(C$_1$–C$_4$alkyl), or the radicals phenyl, naphthyl, thienyl or furyl are substituted by C$_1$–C$_{12}$alkoxy or by C$_1$–C$_4$alkoxy, which is substituted by —COO(C$_1$–C$_{18}$alkyl) or —CO(OCH$_2$CH$_2$)$_n$OCH$_3$, or the radicals phenyl, naphthyl, thienyl, furyl or pyridyl are substituted by —(OCH$_2$CH$_2$)$_n$OH, —(OCH$_2$CH$_2$)$_n$OCH$_3$, C$_1$–C$_8$alkylthio, phenoxy, —COO(C$_1$–C$_{18}$alkyl), —CO(OCH$_2$CH$_2$)$_n$OCH$_3$, phenyl or benzoyl;
n is 1–20;
m is 1 or 2;
R$_3$ is C$_1$–C$_{12}$alkyl, C$_2$–C$_4$alkyl which is substituted by —OH, -C$_1$–C$_4$alkoxy, —CN or —COO(C$_1$–C$_4$alkyl), or R$_3$ is C$_3$–C$_5$alkenyl, C$_5$–C$_{12}$cycloalkyl or phenyl-C$_1$–C$_3$alkyl;
R$_4$ is C$_1$–C$_{12}$alkyl, C$_2$–C$_4$alkyl which is substituted by —OH, -C$_1$–C$_4$alkoxy, —CN or —COO(C$_1$–C$_4$alkyl), or R$_4$ is C$_3$–C$_5$alkenyl, C$_5$–C$_{12}$cycloalkyl, phenyl-C$_1$–C$_3$alkyl or phenyl which is unsubstituted or substituted by C$_1$–C$_{12}$alkyl, C$_1$–C$_4$alkoxy or —COO (C$_1$–C$_4$alkyl), or R$_4$, together with R$_2$, is C$_1$–C$_7$alkylene, phenyl-C$_1$–C$_4$alkylene, o-xylene, 2-butenylene or C$_2$–C$_3$oxaalkylene,
or R$_3$ and R$_4$ together are C$_4$–C$_7$alkylene which can be interrupted by —O—, —S— or —CO—, or R$_3$ and R$_4$ together are C$_3$–C$_7$alkylene which can be substituted by OH, C$_1$–C$_4$alkoxy or —COO(C$_1$–C$_4$alkyl);

$R_5$, $R_6$, $R_7$, $R_8$ and $R_9$ are each independently of one another hydrogen, halogen, $C_1$–$C_{12}$alkyl, cyclopentyl, cyclohexyl, phenyl, benzyl, benzoyl or a group —$OR_{17}$, —$SR_{18}$, —$SOR_{18}$, —$SO_2R_{18}$, —$N(R_{20})(R_{19})$, —NH—$SO_2R_{21}$ or

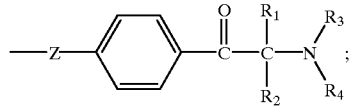

Z is —O—, —S—, —$N(R_{11})$—, —$N(R_{11})$—$R_{12}$—$N(R_{11})$— or

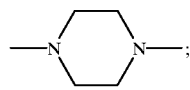

$R_{10}$ is hydrogen, $C_1$–$C_{12}$alkyl, halogen or $C_2$–$C_8$alkanoyl;
$R_{11}$ is $C_1$–$C_8$alkyl, $C_3$–$C_5$alkenyl, phenyl-$C_1$–$C_3$alkyl, $C_1$–$C_4$hydroxyalkyl or phenyl;
$R_{12}$ is unbranched or branched $C_2$–$C_{16}$alkylene, which can be interrupted by one or more —O— or —S—;
$R_{13}$ is hydrogen, $C_1$–$C_8$alkyl or phenyl;
$R_{14}$, $R_{15}$ and $R_{16}$ are each independently of one another hydrogen or $C_1$–$C_4$alkyl, or $R_{14}$ and $R_{15}$ together are $C_3$–$C_7$alkylene;
$R_{17}$ is hydrogen, $C_1$–$C_{12}$alkyl, $C_2$–$C_6$alkyl which is substituted by —SH, —CN, —OH, $C_1$–$C_4$alkoxy, $C_3$–$C_6$alkenoxy, —$OCH_2CH_2CN$, —$OCH_2CH_2COO(C_1$–$C_4$alkyl), —COOH or —O—CO—$C_1$–$C_4$alkyl which is unsubstituted or substituted by SH, or $R_{17}$ is —$COO(C_1$–$C_4$alkyl), or $R_{17}$ is $C_1$–$C_6$alkyl which is interrupted by one or more —O—, or $R_{17}$ is —$(CH_2CH_2O)_nH$, $C_2$–$C_8$alkanoyl, $C_3$–$C_{12}$alkenyl, cyclohexyl, hyroxycyclohexyl, phenyl which is unsubstituted or substituted by halogen, $C_1$–$C_{12}$alkyl or $C_1$–$C_4$alkoxy, or $R_{17}$ is phenyl-$C_1$–$C_3$alkyl or —$Si(C_1$–$C_8$alkyl)$_r$(phenyl)$_3$.
r is 1, 2 or 3;
$R_{18}$ is hydrogen, $C_1$–$C_{12}$alkyl, $C_3$–$C_{12}$alkenyl, cyclohexyl, $C_2$–$C_{12}$alkyl which is substituted by —SH, —OH, —CN, —COOH, —$COO(C_1$–$C_4$alkyl), $C_1$–$C_4$alkoxy, —$OCH_2CH_2CN$ or —O—CO—$C_1$–$C_4$alkyl which is unsubstituted or substituted by SH or $R_{18}$ is —$OCH_2CH_2COO(C_1$–$C_4$alkyl), or $R_{18}$ is $C_1$–$C_{12}$alkyl which is interrupted by —S— or —O—, or $R_{18}$ is phenyl which is unsubstituted or substituted by halogen, SH, $C_1$–$C_{12}$alkyl or $C_1$–$C_4$alkoxy, or $R_{18}$ is phenyl-$C_1$–$C_3$alkyl;
$R_{19}$ and $R_{20}$ are each independently of the other, $C_1$–$C_{12}$alkyl, $C_2$–$C_4$hydroxyalkyl, $C_2$–$C_{10}$alkoxyalkyl, $C_3$–$C_5$alkenyl, $C_5$–$C_{12}$cycloalkyl, phenyl-$C_1$–$C_3$alkyl, phenyl which is unsubstituted or substituted by halogen, $C_1$–$C_{12}$alkyl or $C_1$–$C_4$alkoxy, or $R_{19}$ and $R_{20}$ are $C_2$–$C_3$alkanoyl or benzoyl,
or $R_{19}$ and $R_{20}$ together are $C_2$–$C_8$alkylene which can be interrupted by —O— or —S—, or $R_{19}$ and $R_{20}$ together are $C_2$–$C_8$alkenylene which can be substituted by hydroxyl, $C_1$–$C_4$alkoxy or —$COO(C_1$–$C_4$alkyl); and
$R_{21}$ is $C_1$–$C_{18}$alkyl, phenyl which is unsubstituted or substituted by halogen, $C_1$–$C_{12}$alkyl or $C_1$–$C_8$alkoxy, or $R_{21}$ is naphthyl;
or an acid addition salt of a compound of formula I, II or III;
(B) at least one organic compound which is capable of reacting in a base-catalyzed reaction; and,
(C) optionally, a sensitizer.

A further object of the invention is a process for photochemically generating bases in base-catalysed polymerization reactions, characterized in that a compound of formula I, II or III as defined above is added as a latent base to the mixture to be polymerized and irradiated with light of the wavelength from 200 to 700 nm to generate the base.

At least one compound of the formula I, II or III is present in the inventive composition. Accordingly, mixtures of compounds of the formula I, II or III may be present in the composition, e.g. 1–4, preferably one or two compounds of the formula I, II or III are present.

$C_1$–$C_4$Alkyl $R_{14}$, $R_{15}$ and $R_{16}$ can be, for example, methyl, ethyl, propyl, isopropyl, butyl, isobutyl, sec-butyl or tert-butyl.

$C_1$–$C_8$Alkyl $R_2$, $R_{11}$ and $R_{13}$ can also be, for example, pentyl, hexyl, heptyl, octyl, 2ethylhexyl or 2,2,4,4-tetramethylbutyl, $C_1$–$C_{12}$Alkyl $R_3$, $R_4$, $R_5$, $R_6$, $R_7$, $R_8$, $R_9$, $R_{10}$, $R_{17}$, $R_{18}$, $R_{19}$ and $R_{20}$ can also be, for example, nonyl, decyl, isodecyl, undecyl or dodecyl. $C_3$–$C_5$Alkenyl $R_3$, $R_4$, $R_1$, $R_{19}$ and $R_{20}$ can be, for example, allyl, methallyl, crotyl or dimethylallyl, allyl being preferred. $C_3$–$C_{12}$Alkenyl $R_{17}$ and $R_{18}$ can also be, for example, hexenyl, octenyl or decenyl.

$R_2$, $R_5$, $R_6$, $R_7$, $R_8$ and $R_9$ as cycloalkyl are, in particular, cyclohexyl, $C_5$–$C_{12}$Cycloalkyl $R_3$, $R_4$, $R_{19}$ and $R_{20}$ can also be, for example, cyclooctyl or cyclododecyl.

Phenyl-$C_1$–$C_2$alkyl $R_3$, $R_4$, $R_{17}$, $R_{18}$, $R_{19}$ and $R_{20}$ is, in particular, benzyl.

$C_1$–$C_6$Alkylene Y can be, for example, methylene, or di-, tri-, tetra-, penta- or hexamethylene, $C_1$–$C_7$Alkylene W can be, for example, methylene, ethylene, 1,2-propylene or 1,2-hexylene.

Alkylidene are unbranched or branched alkyl chains, having two free valences at one carbon atom

Accordingly, $C_2$–$C_6$Alkylidene V and W can be, for example, ethylidene, propylidene, isopropylidene, butylidene, isobutylidene or hexylidene.

Examples of $Ar_2$ are the groups phenyl, 1-naphthyl, 2-naphthyl, 2-furyl, 2-thienyl, 4-chlorophenyl, tolyl, 4-isopropylphenyl, 4-octylphenyl, 3-methoxyphenyl, 4-phenoxyphenyl, 4-phenylphenyl, 4-benzoylphenyl and 4-chloro-1-naphthyl.

Examples of substituted alkyl $R_2$ are the groups 2-methoxyethyl, 3-butoxypropyl, 2-isopropoxyethyl, 4-phenoxybutyl, 2-chloroethyl, 3-chloropropyl, 2-phenylethyl or 3-phenyl-propyl.

Examples of substituted phenyl $R_2$ are the groups of 4-chlorophenyl, 3-methoxyphenyl, 4-tolyl or 4-butylphenyl.

Substituted alkyl $R_3$ and $R_4$ can be, for example, 2-hydroxyethyl, 2-hydroxypropyl, 2-hydroxyisobutyl, 2-ethoxyethyl, 2-methoxypropyl, 2-butoxyethyl, 2-cyanoethyl, 2-ethoxycarbonylethyl or 2-methoxycarbonylethyl.

Substituted phenyl $R_4$ can be, for example, 3-chlorophenyl, 4-chlorophenyl, 4-tolyl, 4-tert-butylphenyl, 4-dodecylphenyl, 3-methoxyphenyl or 3-methoxycarbonylphenyl.

If $R_4$, together with $R_2$, is alkylene or phenylalkylene, they preferably form, together with the linking C-atom and N-atom, a 5- or 6-membered heterocyclic ring.

If $R_3$ and $R_4$ together are alkylene or interrupted alkylene, they preferably form, together with the linking N-atom, a 5- or 6-membered heterocyclic ring, for example a pyrrolidine, piperidine, morpholine, thiomorpholine or piperidone ring, which can be substituted by one or more alkyl, hydroxyl, alkoxy or ester groups.

$C_2$–$C_8$Alkanoyl $R_{10}$ and $R_{17}$ can be, for example, propionyl, butyryl, isobutyryl, hexanoyl or octanoyl, but preferably acetyl.

$C_1$–$C_4$Hydroxyalkyl or $C_2$–$C_4$hydroxyalkyl $R_{11}$, $R_{19}$ and $R_{20}$ can be, for example, 2-hydroxyethyl, 2-hydroxypropyl or 4-hyroxybutyl.

Alkylene or interrupted alkylene $R_{12}$ can be, for example, ethylene, tri-, tetra-, penta-, hexa-, octa- or dodecamethylene, 2,2-dimethyltrimethylene, 1,3,3-trimethyltetramethylene, 3-oxapentamethylene, 3-oxaheptamethylene, 4,7-dioxadecamethylene, 4,9-dioxadodecamethylene, 3,6,9,12-tetraoxatetradecamethylene or 4-thiaheptamethylene.

If $C_1$–$C_6$alkyl is interrupted by one or more O atoms, it is for example interrupted by 1–3, or one or two O atoms.

If $R_{14}$ and $R_{15}$ together are $C_3$–$C_7$alkylene, they are, in particular, 1,3- or 1,4-alkylene, for example, 1,3-propylene, 1,3-butylene, 2,4-pentylene, 1,3-hexylene, 1,4-butylene, 1,4-pentylene or 2,4-hexylene.

Substituted phenyl $R_{17}$, $R_{18}$, $R_{19}$ and $R_{20}$ can be, for example, 4-chlorophenyl, 3-chlorophenyl, 4-tolyl, 4-tert-butylphenyl, 4-nonylphenyl, 4-dodecylphenyl, 3-methoxyphenyl or 4-ethoxyphenyl.

A —Si($C_1$–$C_8$alkyl)$_r$(phenyl)$_{3-r}$ group $R_{17}$ can be, in particular, —Si($CH_3$)$_3$, —Si(phenyl)$_2CH_3$, —Si($CH_3$)$_2$phenyl, —Si($CH_3$)$_2$—[$CH(CH_3)_2$] or —Si(phenyl)$_3$.

Substituted $C_1$–$C_6$alkyl $R_{17}$ can be, for example, 2-hydroxyethyl, 2-methoxyethyl or 2-allyloxyethyl.

Substituted $C_1$–$C_6$alkyl $R_{18}$ can be, for example, 2-mercaptoethyl, 2-hydroxyethyl, 2-hydroxypropyl, 2-methoxyethyl, —$CH_2CH_2OCH_2CH_2CN$ or —$CH_2CH_2$—$OCH_2CH_2COOCH_3$.

Alkoxyalkyl $R_{19}$ and $R_{20}$ can be, for example, methoxyethyl, ethoxyethyl, 2-ethoxypropyl, 2-butoxyethyl, 3-methoxypropyl or 2-hexyloxyethyl.

$C_2$–$C_3$Alkanoyl $R_{19}$ and $R_{20}$ are, in particular, acetyl.

Substituted phenyl or naphthyl $R_{21}$ can be, for example, 4-tolyl, 4-bromophenyl, 3-chlorophenyl, 4-butylphenyl, 4-octylphenyl, 4-decylphenyl, 4-dodecylphenyl, 3-methoxyphenyl, 4-isopropoxyphenyl, 4-butoxyphenyl, 4-octyloxyphenyl, chloronaphthyl, nonylnaphthyl or dodecylnaphthyl.

If $R_{19}$ and $R_{20}$ together are alkylene or interrupted alkylene, they forms, together with the linking N atom, a heterocyclic ring, preferably a 5- or 6-membered ring, which can be substituted by alkyl, hydroxyl, alkoxy or ester groups. Examples of such rings are pyrrolidine, piperidine, 4-hydroxypiperidine, 3-ethoxycarbonylpiperidine, morpholine or 2,6-dimethylmorpholine rings.

All these compounds have at least one basic amino group and can therefore be converted to the corresponding salts by adding acids. These acids can be inorganic or organic acids. Examples of such acids are HCl, HBr, $H_2SO_4$, $H_3PO_4$, mono- or polycarboxylic acids, for example, acetic acid, oleic acid, succinic acid, sebacic acid, tartaric acid or $CF_3COOH$, and sulfonic acids, for example, $CH_3SO_3H$, $C_{12}H_{25}SO_3H$, p-$C_{12}H_{25}$-$C_6H_4$-$SO_3H$, p-$CH_3$-$C_6H_4$-$SO_3H$ or $CF_3SO_3H$.

Preferred compounds of the formula I are those in which $Ar_1$ is a group of formula IV, $R_5$ and $R_6$ are hydrogen, halogen, $C_1$–$C_{12}$alkyl or a group —$OR_{17}$, —$SR_{18}$, —$SOR_{18}$, —$SO_2$—$R_{18}$, —$N(R_{19})(R_{20})$, —NH—$SO_2R_{21}$ or

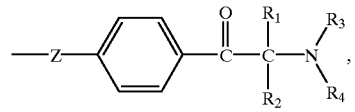

in which Z is —O—, —S—, —$N(R_{11})$— or —$N(R_{11})$—$R_{12}$—$N(R_{11})$—, $R_7$ and $R_8$ are hydrogen, $R_9$ is hydrogen, halogen or $C_1$–$C_{12}$alkyl and $R_1$, $R_2$, $R_3$, $R_4$, $R_{11}$, $R_{12}$, $R_{17}$, $R_{18}$, $R_{19}$, $R_{20}$ and $R_{21}$ are as defined above.

Of compounds of formula I, in which $Ar_1$ is a group of formula IV, wherein $R_5$ is a group —$OR_{17}$, —$SR_{18}$, —$N(R_{19})(R_{20})$ or

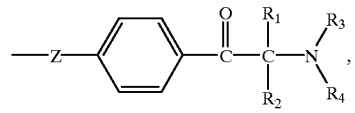

those compounds are preferred in which $R_6$ is hydrogen, halogen or $C_1$–$C_4$alkyl or has one of the meanings given for $R_5$, $R_7$ and $R_8$ are hydrogen or halogen, $R_9$ is hydrogen or $C_1$–$C_4$alkyl, Z is —O—, —S— or —$N(R_{11})$—, $R_1$ and $R_2$ each independently of the other are either (a) $C_1$–$C_6$alkyl, (b) a radical of formula

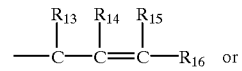

(d) a radical of formula —$CH(R_{13})$—$Ar_2$; in which $Ar_2$ is a phenyl radical which is unsubstituted or substituted by halogen, $C_1$–$C_4$alkyl methylthio, methoxy or benzoyl; $R_3$ and $R_4$ are each independently of the other $C_1$–$C_{12}$alkyl, $C_2$–$C_4$alkyl which is substituted by $C_1$–$C_4$alkoxy, —CN or —COO($C_1$–$C_4$alkyl), or $R_3$ and $R_4$ are allyl, cyclohexyl or benzyl, or $R_3$ and $R_4$ together are $C_4$–$C_6$alkylene which can be interrupted by —O—; $R_{11}$ is $C_1$–$C_4$alkyl, allyl, benzyl or $C_2$–$C_4$alkanoyl; $R_{12}$ is $C_2$–$C_6$alkylene; $R_{13}$, $R_{14}$, $R_{15}$ and $R_{16}$ are each independently of one another hydrogen or methyl; $R_{17}$ is unsubstituted or SH-substituted $C_1$–$C_4$alkyl, 2-hydroxyethyl, 2-methoxyethyl, 2-allyloxyethyl, allyl, cyclohexyl, phenyl, benzyl or —Si($CH_3$)$_3$; $R_{18}$ is hydrogen, unsubstituted or SH-substituted $C_1$–$C_{12}$alkyl, 2-hydroxyethyl, 2-methoxyethyl, unsubstituted or SH-substituted phenyl, or a p-tolyl or benzyl; and $R_{19}$ and $R_{20}$ are each independently of the other $C_1$–$C_{12}$alkyl, $C_2$–$C_6$alkoxyalkyl, acetyl, allyl or benzyl, or $R_{20}$ and $R_{21}$ together are $C_4$–$C_6$alkylene which can be interrupted by —O—.

Particularly preferred compounds of formula I are those in which $Ar_1$ is a group of formula IV wherein $R_5$ is a group —$OR_{17}$, —$SR_{18}$ or —$N(R_{19})(R_{20})$, $R_6$ is hydrogen, chloro or $C_1$–$C_4$alkyl, or has one of the meanings given for $R_5$, $R_7$ and $R_8$ are hydrogen or chloro, $R_9$ is hydrogen or $C_1$–$C_4$alkyl, $R_1$ is either (a) a radical of formula

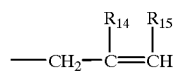

or (b) a radical of formula —CH$_2$—Ar$_2$, in which Ar$_2$ is a phenyl radical which is unsubstituted or substituted by halogen, C$_1$–C$_4$alkyl, CH$_3$S—, CH$_3$O— or benzyl, R$_2$ has one of the meanings given for R$_1$ or is C$_1$–C$_4$alkyl, R$_3$ and R$_4$ are each independently of the other C$_1$–C$_6$alkyl, 2-methoxyethyl, allyl or benzyl, or R$_3$ and R$_4$ together are tetramethylene, pentamethylene or 3-oxapentamethylene, R$_{14}$ and R$_{15}$ are hydrogen or methyl, R$_{17}$ is unsubstituted or SH-substituted C$_1$–C$_4$alkyl, 2-hydroxyethyl, 2-methoxyethyl or phenyl, R$_{18}$ is unsubstituted or SH-substituted C$_1$–C$_{12}$alkyl, 2-hydroxyethyl, 2-methoxyethyl, unsubstituted or SH-substituted phenyl or a p-tolyl, and R$_{19}$ and R$_{20}$ are hydrogen, C$_1$–C$_4$alkyl, 2-methoxyethyl, acetyl or allyl, or R$_{19}$ and R$_{20}$ together are C$_4$–C$_5$alkylene which can be interrupted by —O—.

Specifically preferred is the compound of formula I (4-morpholino-benzoyl)-1-benzyl-1-dimethyl-amino propane.

Further, those compounds of the formula I, wherein A$_1$ is a group of the formula IV are preferred in which R$_5$ is a group —SR$_{18}$, R$_1$ is a benzyl or allyl radical; R$_6$ is hydrogen or methoxy; and R$_7$, R$_8$ and R$_9$ are hydrogen.

Moreover, compounds of the formula I, wherein A$_1$ is a group of the formula IV, and R$_1$ and R$_2$ each independently of the other are C$_1$–C$_8$alkyl, allyl or benzyl; and R$_5$ is a group —OR$_{17}$, —N(R$_{20}$)(R$_{19}$) or —SR$_{18}$ are preferred, specifically (4-methylthiobenzoyl)-1-methyl-1-morpholino ethane.

Preferred are compounds of the formula I, in which Ar$_1$ is a group of the formula IV, wherein, R$_1$ and R$_2$ each indepedently of the other are C$_1$–C$_4$alkyl or benzyl; R$_3$ and R$_4$ each independently of the other are C$_1$–C$_4$alkyl or together are morpholino; R$_5$ is morpholino or c$_1$–C$_4$alkylthio; and R$_6$, R$_7$, R$_8$ and R$_9$ are hydrogen.

Of the compounds of formula I in which Ar$_1$ is a group of formula IV wherein R$_5$ is a group —N(R$_{19}$)(R$_{20}$), those compounds are preferred in which R$_7$ and R$_8$ are hydrogen, and also those in which R$_6$, R$_7$, R$_8$ and R$_9$ are hydrogen, and those in which R$_1$ is allyl or benzyl.

Preferred compounds of formula I are moreover those in which Ar$_1$ is a group of formula IV, wherein R$_6$ is hydrogen, halogen or C$_1$–C$_{12}$alkyl, and R$_6$, R$_7$, R$_8$ and R$_9$ are hydrogen, R$_1$ is allyl or benzyl, R$_2$ is C$_1$–C$_6$alkyl, allyl or benzyl, R$_3$ and R$_4$ are each independently of the other C$_1$–C$_{12}$alkyl, C$_2$–C$_4$alkyl which is substituted by C$_1$–C$_4$alkoxy, —CN or —COO(C$_1$–C$_4$alkyl), or R$_3$ and R$_4$ are allyl, cyclohexyl or benzyl, or R$_3$ and R$_4$ together are C$_4$–C$_6$alkylene which can be interrupted by —O—.

Examples of individual compounds of formula I are disclosed in U.S. Pat. No. 5,077,402, column 7, line 65 to column 16, line 15 as well as in Table 1 of this reference.

The preparation of the compounds of formulas I, II and III is known and is disclosed, inter alia, in U.S. Pat. Nos. 4,582,862, 4,992,547 and 5,077,402.

According to this invention the compounds of formulae I, II and III can be used as latent base catalysts, i.e. as generators of bases, which are activated photochemically, in radiation curable systems. Systems which can be cured are those organic compounds which are capable of reacting in a base-catalyzed reaction which can, for example, be a substitution reaction, an addition reaction or a condensation reaction.

The base is only photogenerated in exposed areas of the composition and therefore e.g. photoimageable thermosetting compositions cured by the photobase catalyst can easily be prepared without any need for an additional radical polymerization process. The process of the present invention is therefore useful for curing compositions which do not necessarily contain ethylenically unsaturated double bonds and provides new photoimageable thermosetting compositions cured by an anionic mechanism.

The component (B) to be cured with the latent bases or in the described process respectively, is generally a compound which contains at least one epoxide group and at least one group which is capable of reacting with epoxides in the presence of a base. Component (B) can also be a mixture of at least one epoxide compound and at least one compound which is capable of reacting with epoxides in the presence of a base.

Compounds capable of reacting with epoxides in the presence of a base are in particular carboxylic compounds, such as carboxylic acids and anhydrides and thiols. Alcohols, amines and amides, generally compounds containing an "active" H-atom are also suitable. Epoxide compounds which may be cured with the latent base compounds according to this invention are generally any compounds containing epoxide groups, monomeric or dimeric epoxides, as well as oligomeric or polymeric compounds having epoxide groups. Typical examples are epoxidized acrylates, glycidyl ethers of bisphenol A, such as 2,2-bis[4-(2,3-epoxypropoxy)phenyl]propane, phenol and cresol epoxy novolacs, glycidyl ethers of aliphatic diols, diglycidyl ether of hydrogenated bisphenol A, typically, 2,2-bis[4-(2,3-epoxypropoxy)cyclohexyl]propane, 1,1,2,2-tetrakis[4-(2,3-epoxypropoxy)phenyl]ethane, triglycidyl isocyanurate, and many others known to the person skilled in the art. Preferred are compounds with at least two epoxide groups.

Epoxide compounds are, inter alia, described in Ullmann's Encyclopedia of Industrial chemistry, 5$^{th}$ Edition, Vol. A9, Weinheim, N.Y., pages 547–553.

In the context of the invention it is possible to use any kind of carboxylic acid, possessing at least one carboxylic acid group, as compound which is able to react with the epoxide, as for example, dicarboxylic acids or polymeric acids. Specific examples are malonic acid, succinic acid, glutaric acid, adipic acid, sebacic acid, phthalic acid, terephthalic acid, maleic acid, cyclohexane dicarboxylic acid, polymeric acids such as partly saponified polyacrylates, for example Carboset resins available from Goodrich USA. Also copolymers of unsaturated compounds with or without acid functions can be employed. Examples are partly esterified styrene-maleic anhydride comopolymers, as sold under the trade name Scripset available from Monsanto. Also copolymers containing both, epoxide and acid groups, can be used in the context of the invention. Examples of suitable anhydrides are in particular dibasic anhydrides. Specific examples are phthalic anhydride, methyltetrahydrophalic anhydride, tetrahydrophthalic anhydride, hexahydrophthalic anhydride, methylhexahydrophthalic anhydride, succinic anhydride, maleic anhydride, itaconic anhydride, and nadic anhydride. Examples are, inter alia, disclosed in U.S. Pat. No. 5,009,982 and JP-A-89-141904. Preferred are compounds with at least 2 acid groups in order to allow crosslinking.

Typically thiols which are suitable are monomeric, oligomeric, aliphatic or aromatic thiols. Specific examples of such thiols are pentaerythritol tetra(mercaptoacetate, pentaerythritol tetra(mercaptopropionate), 4,4'-thiobisbenzenethiol, dithiothreitol, mercaptoethanol, dodecane thiol, thioglycolic acid, 3-mercaptopropionic acid, or ethyleneglycol dimercaptoacetate.

Further examples for systems which are suitable as component (B) in the present invention are disclosed, inter alia, in EP 706 091, EP 747 770, WO 96/41240 and DE 196 22 464. More examples for resins which can be cured with the latent bases according to the invention are, inter alia, disclosed in U.S. Pat. No. 4,943,516.

Important compositions are those, wherein component (B) is a base-catalysed polymerisable or curable organic material. The organic material can be present in form of mono- or poly-functional monomers, oligomers or polymers. Preferred oligomeric/polymeric systems are the following.

Examples of such binder systems which can be catalysed by bases are:

1. Acrylate copolymers with alkoxysliane side groups or alkoxysiloxane side groups, for example the polymers described in U.S. Pat. No. 4,772,672 or U.S. Pat. No. 4,444,974;
2. Two component systems of polyacrylates containing hydroxyl groups, polyesters and/or polyethers and aliphatic or aromatic polyisocyanates;
3. Two component systems of functional polyacrylates and a polyepoxide, the polyacrylate containing carboxyl groups, anhydride groups, thiol groups or amino groups;
4. Two component systems of fluoro-modified or silicon-modified polyacrylates, which contain hydroxyl groups, polyesters and/or polyethers and aliphatic or aromatic polyisocyanates;
5. Two component systems of (poly)ketimines and aliphatic or aromatic polyisocyanates;
6. Two component systems of (poly)ketimines and unsaturated acrylate resins or acetoacetate resins or methyl-α-acrylamido-methyl glycolate;
7. Two component systems of polyacrylates, containing anhydric groups and polyamines;
8. Two component systems of (poly)oxazolidines and polyacrylates, containing anhydric groups or unsaturated acrylate resins or polyisocyanates;
9. Two component systems of polyacrylates containing epoxy groups and polyacrylates containing carboxyl groups or amino groups;
10. Polymers based on allyl/glycidyl ether;
11. Two component systems of a (poly)alcohol and a (poly)isocyanate.

Among these systems, items 1–3 are especially preferred. Suitable are also any mixtures or combinations of the above described compounds.

Catalysed by the base, the components of the system react at ambient or elevated temperature and form a crosslinked coating system which is suitable for many applications.

Component (A) in the novel composition is usually present in an amount of 0.1–20% by weight, preferably 1–10% by weight, for example 1–5% by weight.

The sensitivity of the photobase generator compound to the radiation can be further increased by combining said compounds with a suitable sensitizer (C). Examples for such sensitizers are especially sensitizers from the group of carbonyl compounds having a triplet energy of 225–310 kJ/mol. Examples of appropriate sensitizer compounds furthermore are: xanthones, thioxanthones, phtalimides, anthraquinones, acetophenones, propiophenones, benzophenones, acylnaphthalenes, 2(acylmethylene)-thiazolines, 3-acycoumarins and 3,3'-carbonylbiscoumarins. Preferred sensitizers are thioxanthones, 3-acylcoumarins and 2(aroylmethylene)-thiazolines, thioxanthones and 3-acylcoumarins are particularly preferred.

Examples of individual compounds which can be used as component (C) according to the invention are disclosed in U.S. Pat. No. 4,992,547, column 16 line 58 to column 17 line 51 and are incorporated herein by reference.

These component (C) sensitizers increase the reactivity of the generated amine bases without shortening the shelf life of the compositions.

The amount of sensitizer (C) in the composition is from 0.01 to 5% by weight, preferably from 0.025 to 2% by weight.

The fact that the photocleavage of the latent base generator compounds of formulae I, II and III also generates radicals is especially useful in dual curing systems (=hybrid systems), where both a radical initiator and a base catalyst are needed. Accordingly, the compounds of formulae I, II and III can be used as latent bases and at the same time as radical initiators in dual curing systems.

The invention therefore also relates to systems, which additionally contain radically polymerizable compounds (D) besides component (B).

Such compounds (D) are unsaturated compounds which may include one or more olefinic double bonds. They may be of low (monomeric) or high (oligomeric) molecular mass. Examples of monomers containing a double bond are alkyl or hydroxyalkyl acrylates or methacrylates, such as methyl, ethyl, butyl, 2-ethylhexyl and 2-hydroxyethyl acrylate, isobornyl acrylate, methyl methacrylate and ethyl methacrylate. Silicone acrylates are also advantageous. Other examples are acrylonitrile, acrylamide, methacrylamide, N-substituted (meth)acrylamides, vinyl esters, such as vinyl acetate, vinyl ethers, such as isobutyl vinyl ether, styrene, alkyl- and halostyrenes, N-vinylpyrrolidone, vinyl chloride and vinylidene chloride.

Examples of monomers containing two or more double bonds are the diacrylates of ethylene glycol, propylene glycol, neopentyl glycol, hexamethylene glycol and of bisphenol A, and 4,4'-bis(2-acryloyloxyethoxy)diphenylpropane, trimethylolpropane triacrylate, pentaerythritol triacrylate or tetraacrylate, vinyl acrylate, dinvinylbenzene, divinyl succinate, diallyl phthalate, triallyl phosphate, triallyl isocyanurate or tris(2-acryloylethyl) isocyanurate.

Examples of polyunsaturated compounds of relatively high molecular mass (oligomers) are acrylated epoxy resins, acrylated polyesters, polyesters containing vinyl ether or epoxy groups, and also polyurethanes and polyethers. Further examples of unsaturated oligomers are unsaturated polyester resins, which are usually prepared from maleic acid, phthalic acid and one or more diols and which have molecular weights from about 500 to 3000. In addition, it is also possible to employ vinyl ether monomers and oligomers, and also maleate-terminated oligomers with polyester, polyurethane, polyether, polyvinyl ether and epoxide main chains. Of particular suitability are combinations of oligomers which carry vinyl ether groups and of polymers as described in WO 90/01512. However, copolymers of vinyl ether and maleic acid-functionalized monomers are also suitable. Unsaturated oiligomers of this kind can also be referred to as prepolymers.

Particularly suitable examples are esters of ethylenically unsaturated carboxylic acids and polyols or polyepoxides, and polymers having ethylenically unsaturated groups in the chain or in side groups, for example unsaturated polyesters, polyamides and polyurethanes and copolymers thereof, alkyd resins, polybutadiene and butadiene copolymers, polyisoprene and isoprene copolymers, polymers and copolymers containing (meth)acrylic groups in side chains, and also mixtures of one or more of these polymers.

Examples of unsaturated carboxylic acids are acrylic acid, methacrylic acid, crotonic acid, itaconic acid, cinnamic acid, and unsaturated fatty acids such as linolenic acid or oleic acid. Acrylic and methacrylic acid are preferred.

Suitable polyols are aromatic and, in particular, aliphatic and cycloaliphatic polyols. Examples of aromatic polyols are hydroquinone, 4,4'-dihydroxybiphenyl, 2,2-di(4-hydroxy-phenyl)-propane, and also novolacs and cresols. Examples of polyepoxides are those based on the above-mentioned polyols, especially the aromatic polyols, and epichlorohydrin. Other suitable polyols are polymers and copolymers containing hydroxy groups in the polymer chain or in side groups, examples being polyvinyl alcohol and copolymers thereof, or polyhydroxyalkyl methacrylates or copolymers thereof. Further suitable polyols are oligoesters having hydroxy end groups.

Examples of aliphatic and cycloaliphatic polyols are alkylenediols having preferably 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris($\beta$-hydroxyethyl)amine, trimethylolethane, trimethylolpropane, pentaeryythritol, dipentaerythritol and sorbitol.

The polyols may be partially or completely esterified with one unsaturated carboxylic acid or with several different unsaturated carboxylic acids, and in partial esters the free hydroxyl groups may be modified, for example etherified or esterified, with other carboxylic acids.
Examples of esters are:

Trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol ditaconate, dipentaerythritol trisitaconate, dipentaerythritol pentaitaconate, dipenterythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylates and methacrylates, glycerol diacrylate and triacrylate, 1,4-cyclohexane diacrylate, biasacrylates and bismethacrylates of polyethylene glycol having a molecular weight from 200 to 1500, or mixtures thereof.

Suitable components (D) are also the amides of identical or different unsaturated carboxylic acids with aromatic, cycloaliphatic and aliphatic polyamines having preferably 2 to 6, especially 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-$\beta$-aminoethyl ether, diethylenetriamine, triethylenetetramine, di($\beta$-aminoethoxy)- or di($\beta$-aminopropoxy)ethane. Other suitable polyamines are polymers and copolymers, preferably containing additional amino groups in the side chain, and oligoamides having amino end groups. Examples of such unsaturated amides are methylenebisacrylamide, 1,6-hexamethylenebisacrylamide, diethylenetriaminetrismethacrylamide, bis(methacrylamidopropoxy)ethane, $\beta$-methacrylamidoethyl methacrylate and N-[($\beta$-hydroxyethoxy)ethyl]acrylamide.

Suitable unsaturated polyesters and polyamides are derived, for example, from maleic acid and from diols or diamines. Some of the maleic acid can be replaced by other dicarboxylic acids. They can be used together with ethylenically unsaturated comonomers, for example styrene. The polyesters and polyamides may also be derived from dicarboxylic acids and from ethylenically unsaturated diols or diamines, especially from those having relatively long chains of, for example 6 to 20 carbon atoms. Examples of polyurethanes are those composed of saturated or unsaturated diisocyanates and of unsaturated or saturated diols, respectively.

Polybutadiene and polyisoprene, and copolymers thereof, are known. Examples of suitable comonomers are olefins, such as ethylene, propene, butene and hexene, (meth)acrylates, acrylonitrile, styrene or vinyl chloride. Polymers with (meth)acrylate groups in the side chain are likewise known. They may, for example, be reaction products of epoxy resins based on novolacs with (meth)acrylic acid, or may be homo- or copolymers of vinyl alcohol or hydroxyalkyl derivatives thereof which are esterified with (meth)acrylic acid, or may be homo- and copolymers of (meth)acrylates which are esterified with hydroxyalkyl (meth)acrylates.

The photopolymerizable compounds can be used alone or in any desired mixture. It is preferred to use mixtures of polyol (meth)acrylates.

Binders can also be added to the novel compositions and this is particularly expedient when the photopolymerizable compounds are liquid or viscous substances. The quantity of binder may, for example, be 5–95%, preferably 10–90% and especially 40–90%, by weight based on the overall solids content. The choice of binder is made depending on the field of application and on properties required for this field, such as the capacity for development in aqueous and organic solvent systems, adhesion to substrates and sensitivity to oxygen.

Examples of suitable binders are polymers having a molecular weight of about 5000 to 2000000, preferably 10000 to 1000000. Typical examples are: homo- and copolymers of acrylates and methacrylates, for example copolymers of methyl methacrylate/ethyl acrylate/methacrylic acid, poly(alkyl methacrylates), poly(alkyl acrylates); celluose esters and cellulose ethers, such as cellulose acetate, cellulose acetobutyrate, methylcellulose, ethylcellulose; polyvinylbutyral, polyvinylformal, cyclized rubber, polyethers such as polyethylene oxide, polypropylene oxide and polytetrahydrofuran; polystyrene, polycarbonate, polyurethane, chlorinated polyolefins, polyvinyl chloride, vinyl chloride/vinylidene chloride copolymers, copolymers of vinylidene chloride with acrylonitrile, methyl methacrylate and vinyl acetate, polyvinyl acetate, copoly(ethylene-vinyl acetate), polymers such as polycaprolactam and poly(hexamethyleneadipamide), and polyesters such as poly(ethylene glycol terephthalate) and poly(hexamethylene glycol succinate).

The unsaturated compounds can also be used as a mixture with non-photopolymerizable, film-forming components.

These may, for example, be physically drying polymers or solutions thereof in organic solvents, for instance nitrocellulose or cellulose acetobutyrate. They may also, however, be chemically and/or thermally curable (heat-curable) resins, examples being polyisocyanates, polyepoxides and melamine reins. The use of heat-curable resins concommittantly is important for use in such systems (also called hybrid systems), which are photopolymerized in a first stage and then crosslinked by means of thermal aftertreatment in a second stage.

In hybrid systems (as well the ones comprising anionically and radically curable components, as well as the ones comprising chemically and thermally curable components) the photopolymerizable mixtures, in addition to the photoinitiator, may include various additives, Examples of these are thermal inhibitors, which are used to prevent premature polymerization, examples being hydroquinone, hydroquinone derivatives, p-methoxyphenol, β-naphthol or sterically hindered phenols, such as 2,6-di-tert-butyl-p-cresol. In order to increase the stability on storage in the dark it is possible, for example, to use copper compounds, such as copper naphthenate, stearate or octoate, phosphorus compounds, for example triphenylphosphine, triethyl phosphite, triphenyl phosphite or tribenzyl phosphite. To exclude atmospheric oxygen during the polymerization in hybrid systems it is possible to add paraffin or similar waxlike substances which, being of inadequate solubility in the polymer, migrate to the surface at the beginning of polymerization and form a transparent surface layer which prevents the ingress of air. It is also possible to apply and oxygen-impermeable layer. Light stabilizers which can be added in a small quantity are UV absorbers, for example those of the hydroxyphenylbenzotriazole, hydroxyphenylbenzophenone, oxalamide or hydroxyphenyl-s-triazine type. These compounds can be used individually or in mixtures, with or without sterically hindered amines (HALS) of suitable (low) basicity, e.g. bis(1-octyloxy-2,2,6,6-tetramethylpiperidyl)succinate.

Examples of such UV absorbers and light stabilizers are 1. 2-(2'-hydroxyphenyl)benzotriazoles for example 2-(2'-hydroxy-5'-methylphenyl)-benzotriazole, 2-(3',5'-di-tert-butyl-2'-hydroxyphenyl)benzotriazole, 2-(5'-tert-butyl-2'-hydroxyphenyl)benzotriazole, 2-(2'-hydroxy-5'-(1,1,3,3,-tetramethylbutyl)phenyl)-benzotriazole, 2-(3',5'-di-tert-butyl-2'-hydroxyphenyl)-5-chlorobenzotriazole, 2-(3'-tert-butyl-2'-hydroxy-5'-methylphenyl)-5-chlorobenzotriazole, 2-(3'-sec-butyl-5'-tert-butyl-2'-hydroxyphenyl) benzotriazole, 2-(2'-hydroxy-4'-octoxyphenyl) benzotriazole, 2-(3',5'-di-tert-amyl-2'-hydroxyphenyl) benzotriazole, 2-(3',5'-bis-(α,α-dimethylbenzyl)-2'-hydroxyphenyl)-benzotriazole, mixture of 2-(3'-tert-butyl-2'-hydroxy-5'-(2-octyloxycarbonylethyl)phenyl)-5-chlorobenzotriazole, 2-(3'-tert-butyl-5'-[2-(2-ethylhexyloxy)carbonylethyl]-2'-hydroxyphenyl)-5-chlorobenzotriazole, 2-(3'-tert-butyl-2'-hydroxy-5'-(2-methoxycarbonylethyl)phenyl)-5-chlorobenzotriazole, 2-(3'-tert-butyl-2'-hydroxy-5'-(2-methoxycarbonylethyl) phenyl)benzotriazole, 2-(3'-tert-butyl-2'-hydroxy-5'-(2-octyloxycarbonylethyl)phenyl)benzotriazole, 2-(3'-tert-butyl-5'-[2-(2-ethylhexyloxy)carbonylethyl]-2'-hydroxyphenyl)benxotriazole, 2-(3'-dodecyl-2'-hydroxy-5'-methylphenyl)benzotriazole, and 2-(3'-tert-butyl-2'-hydroxy-5'-(2-isooctyloxycarbonylethyl) phenylbenzotriazole, 2,2'-methylenebis[4-(1,1,3,3-tetramethylbutyl)-6-benzotriazol-2-yl-phenol]; transesterification product of 2-[3'-tert-butyl-5'-(2-methoxycarbonylethyl)-2'-hydroxyphenyl]benzotriazole with poly-ethylene glycol 300; [R—CH$_2$CH$_2$—COO(CH$_2$)$_3$]$_2$— where R=3'-tert-butyl-4'-hydroxy-5'-2H-benzotriazole-2-yl-phenyl.

2. 2-Hydroxybenzophenones, for example the 4-hydroxy-, 4-methoxy-, 4-octoxy-, 4-decyloxy-, 4-dodecyloxy-, 4benzyloxy-, 4,2',4'-trihydroxy- and 2'-hydroxy-4,4'-dimethoxy derivative.

3. Esters of unsubstituted or substituted benzoic acids, for example 4-tert-butylphenyl salicylate, phenyl salicylate, octylphenyl salicylate, dibenzoylresorcinol, bis(4-tert-butylbenzoyl)resorcinol, benzoylresorcinol, 2,4-di-tert-butylphenyl 3,5-di-tert-butyl-4-hydroxybenzoate, hexadecyl, 3,5-di-tert-butyl-4-hydroxybenzoate, octadecyl 3,5-di-tert-butyl-4-hydroxybenzoate and 2-methyl-4,6-di-tert-butylphenyl 3,5-di-tert-butyl-4-hydroxybenzoate.

4. Acrylates, for example isooctyl or ethyl α-cyano-β,β-diphenyl acrylate, methyl α-carbomethoxycinnamate, butyl or methyl α-cyano-β-methyl-p-methoxycinnamate, methyl α-carbomethoxy-p-methoxycinnamate and N-(β-carbomethoxy-β-cyanovinyl)-2-methyl-indoline.

5. 2-(2-Hydroxyphenyl)-1,3,5-triazines, for example 2,4,6-tris(2-hydroxy-4-octyloxyphenyl)-1,3,5-triazine, 2-(2-hydroxy-4-octyloxyphenyl)-4,6-bis(2,4-dimethylphenyl)-1,3,5-triazine, 2-(2,4-dihydroxyphenyl)-4,6-bis(2,4-dimethylphenyl)-1,3,5-triazine, 2,4-bis-(2-hydroxy-4-propyloxy-phenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis (2,4-dimethylphenyl)-1,3,5-triazine, 2-[2-hydroxy-4-(2-hydroxy-3-butyloxy-propyloxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-dodecyl/tridecyl-oxy-(2-hydroxypropyl)oxy-2-hydroxyphenyl]-4,6-bis(2,4-dimethylphenyl)-1,3,5-triazine.

6. Phosphites and phosphonites, for example triphenyl phosphite, diphenyl alkyl phosphites, phenyl dialkyl phosphites, tris(nonylphenyl) phosphite, trilauryl phosphite, trioctadecyl phosphite, distearyl pentaerythritol diphosphite, tris(2,4-di-tert-butylphenyl) phosphite, diisodecyl pentaerythritol diphosphite, bis(2,4-di-tert-butylphenyl) pentaerythritol diphosphite, bis(2,6-di-tert-butyl-4-methylphenyl) pentaerythritol diphosphite, bis-isodecyloxy pentaerythritol diphosphite, bis(2,4-di-tert-butyl-6-methylphenyl) pentaerythritol diphosphite, bis(2,4,6-tri-tert-butylphenyl) pentaerythritol diphosphite, tristearyl sorbityl triphosphite, tetrakis(2,4-di-tert-butylphenyl)-4,4'-biphenylene diphosphonite, 6-isooctyloxy-2,4,8,10-tetra-tert-butyl-12H-dibenzo[d,g]-1,3,2-dioxaphosphocine, 6-fluoro-2,4,8,10-tetra-tert-butyl-12-methyl-dibenzo[d,g]-1,3,2-dioxaphosphocine, bis(2,4-di-tert-butyl-6-methylphenyl) methyl phosphite and bis(2,4-di-tert-butyl-6-methylphenyl) ethyl phosphite.

Further customary additives for the compositions according to the invention, depending on the intended use, are fluorescent whitening agents, fillers, pigments, dyes, wetting agents, levelling assistants, flow improvers and adhesion promoters.

In order to cure thick and pigmented coating it is appropriate to add glass beads or pulverized glass fibres, as described for example in U.S. Pat. No. 5,013,768.

In certain cases, especially for systems comprising components which are curable by different mechanisms, it may be of advantage, to add one or more other known photoinitiators (E) in addition to component (A), for example benzophenone, benzophenone derivatives, acetophenone, acetophenone derivatives, phenylglyoxalates, diketones (e.g. camphor quinone), anthraquinones, thixanethones, acridines, electron transfer initiators, (e.g. borate/dye systems), α-hydroxycycloalkyl phenyl ketones, dialkoxyacetophenones, α-hydroxyacetophenones, 4-aroyl-1,3-dioxolanes, benzoin alkyl ethers and benzil ketals, monoacyl phosphine oxides, bisacyl phosphine oxides, trisacylphosphine oxides, titanocenes or ferrocenium compounds, triazine and keto oximes.

Examples of particularly suitable photoinitiators are: 1-(4-dodecylbenzoyl-1-hydroxy-1-methylethane, 1-(4-isopropylbenzoyl)-1-hydroxy-1-methylethane, 1-benzoyl-1-hydroxy-1-methylethane, 1-[4-(2-hydroxyethoxy)benzoyl]-1-hydroxy-1-methylethane, 1-[4-(acryloyloxyethoxy)benzoyl]-1-hydroxy-1-methylethane, diphenyl ketone, phenyl-1-hydroxy-cyclohexyl ketone, benzil dimethyl ketal, bis(cyclopentadienyl)bis(2,6-difluoro-3-pyrryl-phenyl) titanium, cyclopentadienyl-arene-iron(II) complex salts, for example $(\eta^\beta$-iso-propylbenzene)$(\eta^5$-cyclopentadienyl)iron (II) hexafluorophosphate, trimethylbenzoyldiphenylphosphine oxide, bis(2,6-dimethoxybenzoyl)-(2,4,4-trimethyl-pentyl)phosphine oxide, bis(2,4,6-trimethylbenzoyl)-2,4-dipentoxyphenylphosphine oxide or bis(2,4,6-trimethylbenzoyl)phenyl-phosphine oxide.

The invention therefore also provides compositions which, in addition to the latent base photoinitiator (A), also comprise at least one further photoinitiator for radical polymerization (E) and/or other customary additives.

The compounds of formulae I, II and III are suitable as photobase generators. Accordingly, they can be used in a process for carrying out base-catalysed reactions. The process is charcterized in that a composition as described above is irradiated with light having wavelengths from 200 to 700 nm.

The invention therefore also relates to a process for photochemically generating bases in base-catalysed polymerization reactions, characterized in that a compound of formula I, II or III as defined above is added, as latent base, to the mixture to be polymerized and irradiated with light of the wavelength from 200 to 700 nm to generate the base. Said process may be carried out in the presence of a sensitizer selected from the group of carbonyl compounds having a triplet energy of 225–310 kJ/mol. Such sensitizer compounds are described above and are referred to as component (C) of the novel composition.

In some cases it is advantageous to heat the composition during or after the irradiation. The crosslinking reaction may often be accelerate, thereby in another of it's aspects the invention therefore relates to a process for curing compositions comprising (A) a compound of formula I, II or III as defined above, (B) at least one organic compound which is capable of reacting in a base-catalyzed addition reaction or substitution reaction; and, (C) optionally, a sensitizer, wherein (1) said composition is irradiated with light having a wavelength from 200 to 700 nm to generate a base catalyst from the photosensitive precursor of formula I, II or III and (2) is subsequently thermally cured using as a catalyst the base photogenerated in step (1).

The photosensitivity of the novel compositions extends in general from about 200 nm to 700 nm. Suitable radiation is present, for example, in sunlight or light from artificial light sources. Consequently, a large number of very different types of light source are employed. Both point sources and arrays ("lamp carpets") are suitable. Examples are carbon arc lamps, xenon arc lamps, medium-, high- and low-pressure mercury lamps, possibly doped with metal halide (metal-halogen lamps), microwave-excited metal vapour lamps, excimer lamps, superactinic fluoroescent tubes, fluoroescent lamps, argon incandescent lamps, electronic flashlamps, photographic floodlamps, electron beams and X-rays, produced by means of synchrotrons or laser plasma. The distance between the lamp and the substrate to be exposed in accordance with the invention may vary depending on the intended application and the type and output of the lamp, and may be, for example, from 2 cm to 150 cm. Laser light sources, for example excimer lasers, are especially suitable. Lasers in the visible region can also be employed. In this case, the high sensitivity of the novel materials is very advantageous. By this method it is possible to produce printed circuits in the electronics industry, lithographic offset printing plates or relief printing plates, and also photographic image-recording materials.

The temperature for the thermal step (2) can range from ambient temperature (about 25° C.) to 180° C. The preferred temperature range depends on the particular based-catalysed reaction. For example for acid/epoxy systems, the temperature range is from 70° C. to 160° C., for expoxy/thiols reactions the temperature range is from ambient temperature to 120° C.

The invention also relates to a process as described above, wherein the thermal curing step (2) is followed by a development step (3).

Development means the removing of non-crosslinked parts of the composition. The person skilled in the art is familiar with the appropriate development methods.

It is possible to conduct the above process such, that the photochemical step (1) is followed by a development step (3), prior to the thermal curing step (2) or such, that the steps (1), (2) and (3) are followed by a second thermal curing step (4).

An additional base catalyst, other than a compound of formulae I, II or III or a precursor of such a catalyst, may of course be added to the composition as a co-catalyst for the thermal step (2).

Such catalysts are for example imidazole derivatives, triazine derivatives, guanidine derivatives. Specific examples for 2PHZ, 2E4MZ-CNS, (Imidizole derivatives from Shikoku Chemicals.), acetoguanamine, benzoguanamine, dicyandiamide. The use of these thermal catalysts is described, for example in: U.S. Pat. No. 4,943, 516, JP 7-278266, JP 1-141904, JP 3-71137, JP 6-138655, JP 5-140251, JP6-67430, JP 3-172317, JP 6-161108), JP 7-26183).

As the compounds of the formuae I, II and III are also useful as radical photoinitiators, as already mentioned above, the process can also be conducted in a hybrid system, namely a mixture of anionically and radically curable components. Accordingly, in this process the composition may additionally comprise a radically polymerizable monomer, oligomer or polymer (D).

The photobase generators according to the present invention are especially useful in applications where high thermal stability and/or good solvent resistance, low electrical conductivity, good mechanical properties are needed as is the case, for example in solder resists, conformal coatings, encapsulation of electric devices, stereolithography etc.. Furthermore they are useful for the photoimaging of compositions using a base-catalysed mechanism or dual curing (radical and anionic), wherein the α-aminoketone compounds are at the same time radical photoinitiators and photobase generators (such compositions are described above).

The invention also provides compositions further to components (A) and (B) comprising at least one ethylenically unsaturated, photopolymerizable compound which is emulsified, dispersed or dissolved in water.

Radiation-curable, aqueous prepolymer dispersions of this type are commercially available in numerous variations. This term is taken to mean a dispersion of water and at least one prepolymer dispersed therein. The concentration of water in these systems is, for example, from 5 to 80% by weight, in particular from 30 to 60% by weight. The radiation-curable prepolymer or prepolymer mixture is present, for example, in concentrations of from 95 to 20% by weight, in particular from 70 to 40% by weight. The total of the percentages indicated for water and prepolymers in these compositions is in each case 100, to which are added the auxiliaries and additives in various amounts depending on the intended application.

The radiation-curable, water-dispersed, film-forming prepolymers, which are frequently also dissolved, are, for aqueous prepolymer dispersions, monofunctional or polyfunctional ethylenically unsaturated prepolymers which are known per se, can be initiated by means of free radicals and contain, for example, from 0.01 to 1.0 mol of polymerizable double bonds per 100 g of prepolymer, and have a mean molecular weight of, for example, at least 400, in particular from 500 to 10,000. Depending on the intended application, however, prepolymers having higher molecular weights might also be suitable.

For example, use is made of polyesters containing polymerizable C—C double bonds and having a maximum acid number of 10, polyethers containing polyermizable C—C double bonds, hydroxyl-containing products of the reaction of a polyepoxide containing at least two epoxide groups per molecule with at least one α,β-ethylenically unsaturated carboxylic acid, polyurethane (meth)acrylates, and α,β-ethylenically unsaturated acrylic copolymers containing acrylic radicals, as are described in EP-A-12 339. Mixtures of these prepolymers may also be used. Also suitable are the polymerizable prepolymers described in EP-A-33 896, which are thioether adducts of polymerizable prepolymers having a mean molecular weight of at least 600, a carboxyl group content of from 0.2 to 15% and a content of from 0.01 to 0.8 mol of polymerizable C—C double bonds per 100 g of prepolymer. Other suitable aqueous dispersions based on specific alkyl (meth)acrylate prepolymers are described in EP-A-41 125; suitable water-dispersible, radiation-curable prepolymers made from urethane acrylates are disclosed in DE-A-2 936 039.

Water dilutable or waterborn resist compositions are described for example in JP-A 4-169985, JP-A 4-169986, JP-A 4-169987 and JP-A 4-31361.

These radiation-curable, aqueous prepolymer dispersions may include, as further additives, dispersion assistants, emulsifiers, antioxidants, light stabilizers, dyes, pigments, fillers, for example talc, gypsum, silica, rutile, carbon black, zinc oxide and iron oxides, reaction accelerators, levelling agents, lubricants, wetting agents, thickeners, matting agents, defoamers and other assistants which are customary in coatings technology. Suitable dispersion assistants are water-soluble organic compounds of high molecular mass which contain polar groups, examples being polyvinyl alcohols, polyvinylpyrrolidone and cellulose ethers. Emulsifiers which can be used are nonionic emulsifiers and possibly also ionic emulsifiers.

The compositions according to the invention can also be used for radiation-curable powder coatings. The powder coatings can be based on the described resin compositions including hybrid systems. A UV-curable powder coating can be formulated by mixing polymers with carboxylic acid groups with epoxides and adding the photo base generator (or mixtures thereof). Hybrid powder coatings can also be formulated by adding solid resins and monomers containing reactive double bonds to polymers bearing carboxylic acid groups and epoxides and the photo base generators (alone or in combination with radical initiators). The resins and monomers containing reactive double bonds are for example maleates, vinyl ethers, acrylates, acrylamides and mixtures thereof. The powder coatings may also comprise binders as are described, for example, in DE-A-42 28 514 and in EP-A-636 669. The powder coatings may additionally comprise white or colored pigments. For example titanium dioxide, preferably rutile titanium dioxide, can be employed in concentrations of up to 50% by weight in order to give a cured powder coating of good hiding power. The procedure normally comprises electrostatic or tribostatic spraying of the powder onto the substrate, for example metal or wood, melting of the powder by heating, and, after a smooth film has formed, radiation-curing of the coating with ultraviolet and/or visible light, using, for example, medium-pressure mercury lamps, metal halide lamps or xenon lamps. The irradiation may take place while the coated articles are still warm to accelerate the curing, but also irradiation after cooling and a second heat treatment (in a different location or after assembling of different parts) is possible. A particular advantage of the radiation-curable powder coating over their heat-curable counterparts is that the flow time after melting of the powder particles can be delayed if desired in order to ensure the formation of a smooth, high-gloss coating. In contrast to heat-curable systems, radiation-curable powder coating can be formulated to melt at lower temperatures without the unwanted effect of shortening their lifetime. For this reason, they are also suitable as coatings for heat-sensitive substrates, for example wood or plastics. In addition the powder coating formulations may also include UV absorbers and other additives. Appropriate examples are listed above.

The photopolymerizable compositions can be used for various purposes, for example as printing ink, as a clear finish, as a white finish, for example for wood or metal, as a coating material, inter alia for paper, wood, metal or plastic, as a powder coating, as a daylight-curable coating for roadmarking and the marking of buildings, for photographic reproduction techniques, for holographic recording materials, for image recording techniques or for producing printing plates which can be developed with organic solvents or with aqueous alkalis, for producing masks for screen printing, as dental filling compositions, as adhesives, including pressure-sensitive adhesives, as laminating resins, as etch resists or permanent resists, and as solder masks and photoimageable dielectric for electronic circuits for electronic circuits, for producing three-dimensional articles by mass curing (UV curing in transparent moulds) or by the stereolithography technique, for producing composite materials and other thick-layers compositions, for coating or sealing electronic components, or as coatings for optical fibres.

In coating materials of hybrid curing systems, use is frequently made of mixtures of a prepolymer with polyunsaturated monomers, which may additionally include a mono-unsaturated monomer as well. It is the prepolymer here which primarily dictates the properties of the coating film, and by varying it the skilled worker is able to influence the properties of the cured film. The polyunsaturated monomer functions as a crosslinking agent which renders the film unsoluble. The monounsaturated monomer functions as a reactive diluent, which is used to reduce the viscosity without the need to employ a solvent.

The novel photocurable compositions are suitable, for example, as coating materials for substrates of all kinds, for example wood, textiles, paper, ceramic, glass, plastics such as polyesters, polyethylene terephthalate, polyolefins or cellulose acetate, especially in the form of films, and also metals such as Al, Cu, Ni, Fe, Zn, Mg or Co and GaAs, Si or $SiO_2$, to which it is intended to apply a protective layer or, by means of imagewise exposure, to generate a reproduced image.

Coating of the substrates can be carried out by applying to the substrate a liquid composition, a solution or a suspension. The choice of solvents and the concentration depend principally on the type of composition and on the coating technique. The solvent should be inert, i.e. it should not undergo a chemical reaction with the components and should be able to be removed again, after coating, in the course of drying. Examples of suitable solvents are ketones, ethers and esters, such as methyl ethyl ketone, isobutyl methyl ketone, cyclopentanone, cyclohexanone, dioxane, tetrahydrofuran, 2-methoxyethanol, 2-ethoxyethanol, 1-methoxy-2-propanol, 1,2-dimethoxyethane, ethyl acetate, n-butyl acetate and ethyl 3-ethoxypropionate.

The solution is applied uniformly to a substrate by means of known coating techniques, for example by spin coating, dip coating, knife coating, curtain coating, brushing, spraying, especially by electrostatic spraying, and reverse-roll coating, and also by means of electrophorectic deposition. It is also possible to apply the photosensitive layer to a temporary, flexible support and then to coat the final substrate, for example a copper-clad circuit board, by transferring the layer via lamination.

The quantity applied (coat thickness) and the nature of the substrate (layer support) are dependent on the desired field of application. The range of coat thicknesses generally comprises values from about 0.1 μm to more than 100 μm.

The novel radiation-sensitive compositions find application as negative resists, having a very high sensitivity to light and being able to be developed in an aqueous alkaline medium without swelling. They are suitable as photoresists for electronics (electroplating resist, etch resist, solder resist), the production of printing plates, such as offset, flexographic and relief printing plates, or screen printing and/or the production of dies, for use in chemical milling or as a microresist in the production of integrated circuits. The possible layer supports, and the processing conditions of the coated substrates, are just as varied.

The compounds according to the invention also find application for the production of single- or multi-layered materials for image recording or image reproduction (copies, reprographics), which may be mono- or polychromatic. In addition, the materials are suitable for colour proofing systems. In these technologies it is possible to apply formulations containing microcapsules and for the image production the radiation curing can be followed by a thermal and/or pressure treatment.

Substrates used for photographic information recording include, for example, polyester or cellulose acetate films, or polymer-coated papers; substrates for offset printing forms are specially-treated aluminium, substrates for producing printed circuits are copper-clad laminates, and substrates for producing integrated circuits are silicon wafers. The layer thicknesses for photographic materials and offset printing forms are generally from about 0.5 μm to 10 μm, while for printed circuits they are from 1.0 μm to about 100 μm.

After the substrates are coated, the solvent is removed, generally by drying, to leave a photoresist coat on the substrate. The temperature range depends on the particular base catalyst reaction, and should be lower than the onset temperature of the uncatalysed reaction.

The term "imagewise" exposure includes both exposure through a photomask comprising a predetermined pattern, for example a slide, exposure by means of light beam (e.g. a laser beam) which, for example, is moved under computer control over the surface of the coated substrate, producing an image in this way, and irradiation with computer-controlled electron beams.

Following the imagewise exposure of the material and prior to development, it may be advantageous to carry out thermal treatment for a short time. In this case only the exposed sections are thermally cured. The temperatures for this post-exposure bake range from ambient temperature (about 25° C.) to 200° C. and depend on the particular base catalysed reaction. Preferred temperatures for the epoxide acid reaction are from 100–160° C. and for the thiol epoxide reaction from ambient temperature to 120° C.

The period of thermal treatment is in general from 0.25 to 10 minutes.

The photocurable composition may additionally be used in a process for producing printing plates or photoresists similar to that described, for example, in DE-A-40 13 358.

After the exposure and, if implemented, thermal treatment, the unexposed areas of the photosensitive coating are removed with a developer in a manner known per se.

As already mentioned, the novel compositions can inter alia be developed with aqueous alkalis. Particularly suitable aqueous-alkaline developer solutions are aqueous solutions of tetraalkyl ammonium hydroxides or of alkali metal silicates, phosphates, hydroxides and carbonates. If desired, minor quantities of wetting agents and/or organic solvents may also be added to these solutions. Examples of typical organic solvents, which may be added to the developer liquids in small quantities, are cyclohexanone, 2-ethoxyethanol, toluene, acetone and mixtures of such solvents.

Another field where photocuring is employed is in coating metals, such as coating metal plates and tubes, cans or bottle caps, and photocuring polymer coatings, for example floor or wall coverings based on PVC. Examples of the photocuring of paper coatings are the colourless finishes of labels, record sleeves and book covers.

The compositions and compounds according to the invention can be used for the production of wave guide and optical switches wherein advantage is taken of the development of a difference in the refraction in the refraction index between irradiated and unirradiated areas.

The use of photocurable compositions for imaging techniques and for the optical production of information carriers is also important. In such applications, as already described above, the layer (wet or dry) applied to the support is irradiated through a photomask with UV or visible light, and the unexposed areas of the layer are removed by treatment with a solvent (=developer). Application of the photocurable layer is metal can also be carried out by electrodeposition. The exposed areas are polymeric through crosslinking and are therefore insoluble and remain on the support. Appropriate colouration produces visible images. Where the support is a metallized layer, the metal can, following exposure and development, be etched away at the unexposed areas or reinforced by electroplating. In this way it is possible to produce printed electronic circuits and photoresists.

The invention additionally provides for the use of the above-described composition for preparing pigmented and unpigmented paints and varnishes, printing inks, powder coatings, printing plates, adhesives, dental compositions, waveguides, optical switches, colour proofing systems, composite compositions, glass fibre cable coatings, screen printing stencils, resist materials, for photographic reproductions, for encapsulating electrical and electronic components, for producing magnetic recording materials, for producing three-dimensional objects by stereolithography, and as image recording material, especially for holographic recordings. The composition is preferably used for the production of resist materials, solder masks, conformal coatings, protective coatings, powder coatings, overprint varnishes, glass fibre coatings, wave guides, printing plates, adhesives, inks, screen printing stencils, reinforced composite materials, optical switches, colour proof systems, magnetic recording media, dental material, in a stereolithographic or holographic process, as well as a process for the production of resist materials, solder masks, conformal coatings, protective coatings, powder coatings, overprint varnishes, glass fibre coatings, wave guides, printing plates, adhesives, inks, screen printing stencils, reinforced composite materials, optical switches, colour proof systems, magnetic recording media, dental materials, or a process conducted as stereolithographic or holographic process.

The compounds of formulae I, II and III are generators of bases which can be activated photochemically and show surprisingly excellent latency before exposure to UV light. They further have a high absorption in the near UV region and high catalytic activity after photocleavage of the substituted benzoyl moiety of the molecule.

The following examples illustrate the invention in more detail. Parts and percentages, as in the remainder of the description and in the claims, are by weight unless indicated otherwise. Where alkyl radicals having more than three carbon atoms are referred to without any mention of specific isomers, the n-isomers are meant in each case.

EXAMPLE 1

Photobase Activity: Proof of the Latency of α-aminoketones Before Irradiation and Catalytic Activity After Irradiation 1.(a) A formulation is prepared by mixing 200 parts of a polyacrylate with 3–5% carboxylic function (®Carboset 525, provided by Goodrich, USA) and 100 parts of an epoxyphenol novolac (GY 1180, provided by Ciba Specialty Chemicals)

A sample of this formulation is subjected to Differential Scanning Calorimetry. The DSC curve (heating rate 10° C./min) shows a peak temperature of 242° C.

1.(b) A formulation is prepared by mixing 200 parts of a polyacrylate with 3–5% carboxylic function (®Carboset 525, provided by Goodrich, USA) and 100 parts of an epoxyphenol novolac (GY 1180, provided by Ciba Specialty Chemicals)

6 parts of 4-(methylthiobenzoyl)-1-methyl-1-morpholino ethane (®Irgacure 907, provided by Ciba Specialty Chemicals)

A sample of this formulation is subjected to DSC (heating rate 10° C./min). The DSC curve shows a peak temperature of 243° C. A second sample is irradiated during 40 s with a metal halide lamp (ORC SMX3000, 3 kW), the peak shows at 169° C.

1.(c) A formulation is prepared by mixing 200 parts of a polyacrylate with 3–5% carboxylic function (®Carboset 525, provided by Goodrich, USA) and 100 parts of an epoxyphenol novolac (GY 1180, provided by Ciba Specialty Chemicals)

6 parts of (4-morpholinobenzoyl)-1-benzyl-1-dimethylaminopropane (®Irgacure 369, provided by Ciba Specialty Chemicals)

A sample of this formulation is subjected to DSC (heating rate 10° C./min). The DSC curve shows a peak temperature of 212° C. A second sample is irradiated during 40 s with a metal halide lamp (ORC SMX3000, 3 kW), the peak shows at 152° C.

EXAMPLE 2

2.(a) A formulation is prepared by mixing 200 parts of a polyacrylate with 3–5% carboxylic function (®Carboset 525, provided by Goodrich, USA) and 100 parts of an epoxyphenol novolac (GY 1180, provided by Ciba Specialty Chemicals)

9 parts of 4-(methylthiobenzoyl)-1-methyl-1-morpholino ethane (®Irgacure 907, provided by Ciba Specialty Chemicals)

450 parts of acetone 2.(b) A formulation is prepared by mixing 200 parts of a polyacrylate with 3–5% carboxylic function (®Carboset 525, provided by Goodrich, USA) and 100 parts of an epoxyphenol novolac (GY 1180, provided by Ciba Specialty Chemicals)

9 parts of (4-morpholinobenzoyl)-1-benzyl-1-dimethylaminopropane (®Irgacure 369, provided by Ciba Specialty Chemicals)

450 parts of acetone

Samples of the formulations are applied to an aluminum plate using a 100 μm wire-wound bar coater and are dried under air at 50° C. for 15 min. The resulting resist layers, having a thickness of approximately 25 μm, are tightly covered with a polyester foil and this is covered by a standardized test negative with 21 steps of different optical density (Stouffer wedge), and finally, on top is covered by a second polyester film, and the resultant laminate is fixed onto a metal plate. The sample is irradiated with a 3 kW metal halide lamp (ORC SMX3000) at a distance of 60 cm for 80 seconds in a first test series, for 160 seconds in a second test series and for 320 seconds in a third test series. After this irradiation, the samples are heated for 5 min at 150° C. in the case of formulation (a) and at 130° C. in the case of formulation (b). Then the samples are developed in ethanol in an ultrasonic bath for 5 min. The highest tack-free step of the resist is determined as a measure for the sensitivity of the resist. The higher the number of steps, the more reactive is the resist formulation. The results are summarized in table 1.

TABLE 1

| Formulation | Number of steps achieved after irradiation for | | |
|---|---|---|---|
| | 80 s | 160 s | 320 s |
| 2.(a) | 6 | 8 | 10 |
| 2.(b) | 6 | 8 | 10 |

EXAMPLE 3

Photobase Activity: Proof of the Latency of α-aminoketones Before Irradiation and Catalytic Activity After Irradiation Formulation 3.(a):
200 parts of an epoxyphenol novolac (GY 1180, provided by Asahi CIBA, Japan)
50 parts of 4,4'-thiobisbenzenethiol (provided by Sigma-Aldrich, Japan)
The DSC curve (heating rate 10° C./min) shows a peak temperature of 175° C.

Formulation 3.(b):
200 parts of an epoxyphenol novolac (GY 1180, provided by Asahi CIBA, Japan)
50 parts of 4,4'-thiobisbenzenethiol (provided by Sigma-Aldrich, Japan)
6 parts of 4-(methylthiobenzoyl)-1-methyl-1-morpholino ethane (®Irgacure 907, provided by Ciba Specialty Chemicals)
The DSC curve (heating rate 10° C./min) shows a peak temperature of 167° C. without exposure. After irradiating a sample during 40 s with a metal halide lamp (ORC SMX3000, 3 kW) the DSC curve shows a peak at 71° C.

Formulation 3.(c):
200 parts of an epoxyphenol novolac (GY 1180, provided by Asahi CIBA, Japan)
50 parts of 4,4'-thiobisbenzenethiol (provided by Sigma-Aldrich, Japan)
6 parts of (4-morpholinobenzoyl)-1-benzyl-1-dimethylaminopropane (®Irgacure 369, provided by Ciba Specialty Chemicals)
The DSC curve (heating rate 10° C./min) shows a peak temperature of 172° C. without exposure. After irradiating a sample during 40 s with a metal halide lamp (ORC SMX3000, 3 kW) the DSC curve shows a peak at 44° C.

EXAMPLE 4

Photobase Activity: Proof of the Latency of α-aminoketones Before Irradiation and Catalytic Activity After Irradiation Formulation 4.(a):
200 parts of an epoxy cresolnovolac (ECN1299, provided by Asahi CIBA, Japan)
50 parts of 4,4'-thiobisbenzenethiol (provided by, Sigma-Aldrich, Japan)
The DSC curve (heating rate 10° C./min) shows a peak temperature of 148° C.

Formulation 4.(b):
200 parts of an epoxy cresolnovolac (ECN1299, provided by Asahi CIBA, Japan)
50 parts of 4,4'-thiobisbenzenethiol (provided by, Sigma-Aldrich, Japan)
6 parts of 4-(methylthiobenzoyl)-1-methyl-1-morpholino ethane (®Irgacure 907, provided by Ciba Specialty Chemicals)
The DSC curve (heating rate 10° C./min) shows a peak temperature of 149° C. (onset temp. 105° C.) without exposure and after irradiating a sample during 40 s with a metal halide lamp (ORC SMX3000, 3 kW) the DSC curve shows a peak at 135° C. (onset temp. 50°C.).

Formulation 4.(c):
200 parts of an epoxy cresolnovolac (ECN1299, provided by Asahi CIBA, Japan)
50 parts of 4,4'-thiobisbenzenethiol (provided by, Sigma-Aldrich, Japan)
6 parts of (4-morpholinobenzoyl)-1-benzyl-1-dimethylaminopropane (®Irgacure 369, provided by Ciba Specialty Chemicals)
The DSC curve (heating rate 10° C./min) shows a peak temperature of 145° C. without exposure. After irradiating a sample during 40 s the DSC curve shows a peak at 87° C.

EXAMPLE 5

Photobase Activity: Proof of the Latency of α-aminoketones Before Irradiation and Catalytic Activity After Irradiation Formulation 5.(a):
200 parts of an epoxyphenol novolac (GY 1180, provided by Asahi CIBA, Japan)
50 parts of DL-dithiothreitol (provided by Tokyo Kasei, Japan)
The DSC curve (heating rate 10° C./min) shows a peak temperature of 121° C.

Formulation 5.(b):
200 parts of an epoxyphenol novolac (GY 1180, provided by Asahi CIBA, Japan)
50 parts of DL-dithiothreitol (provided by Tokyo Kasei, Japan)
6 parts of (4-morpholinobenzoyl)-1-benzyl-1-dimethylaminopropane (®Irgacure 369, provided by Ciba Specialty Chemicals)
The DSC curve (heating rate 10° C./min) shows a peak temperature of 121° C. without exposure. After irradiating a sample during 40 s the DSC curve shows a peak at 69° C.

EXAMPLE 6

Photobase Activity: Proof of the Latency of α-aminoketones Before Irradiation and Catalytic Activity After Irradiation Formula 6.(a):
200 parts of epoxy cresolnovolac (ECN1299, provided by Asahi CIBA, Japan)
50 parts of DL-dithiothreitol (provided by Tokyo Kasei, Japan)
The DSC curve (heating rate 10° C./min) shows a peak temperature of 138° C.

Formula 6.(b):
200 parts of epoxy cresolnovolac (ECN1299, provided by Asahi CIBA, Japan)
50 parts of DL-dithiothreitol (provided by Tokyo Kasei, Japan)
6 parts of (4-morpholinobenzoyl)-1-benzyl-1-dimethylaminopropane (®Irgacure 369, provided by Ciba Specialty Chemicals)
The DSC curve (heating rate 10° C./min) shows a peak temperature of 135° C. without exposure. After irradiating a sample for 40 s the DSC peak shows at 91° C.

EXAMPLE 7

Photobase Activity: Proof of the Latency of α-aminoketones Before Irradiation and Catalytic Activity After Irradiation Formula 7.(a):
200 parts of epoxyphenol novolac (GY 1180, provided by Asahi CIBA, Japan)

100 parts of pentaerythritol tetra(mercaptoacetate) (provided by Tokyo Kasei, Japan)

The DSC curve (heating rate 10° C./min) shows a peak temperature of 240° C.

Formula 7.(b):

200 parts of epoxyphenol novolac (GY 1180, provided by Asahi CIBA, Japan)

100 parts of pentaerythritol tetra(mercaptoacetate) (provided by Tokyo Kasei, Japan)

6 parts of 4-(methylthiobenzoyl)-1-methyl-1-morpholino ethane (®Irgacure 907, provided by Ciba Specialty Chemicals)

The DSC curve (heating rate 10° C./min) shows a peak temperature of 243° C. without exposure. After irradiating a sample for 40 s with a metal halide lamp (ORC SMX3000, 3 kW) the DSC peak shows at 161° C.

Formula 7.(c):

200 parts of epoxyphenol novolac (GY 1180, provided by Asahi CIBA, Japan)

100 parts of pentaerythritol tetra(mercaptoacetate) (provided by Tokyo Kasei, Japan)

6 parts of (4-morpholinobenzoyl)-1-benzyl-1-dimethylaminopropane (®Irgacure 369, provided by Ciba Specialty Chemicals)

The DSC curve (heating rate 10° C./min) shows a peak temperature of 242° C. without exposure. After irradiating a sample for 40 s the DSC peak shows at 124° C.

EXAMPLE 8

Photobase Activity: Proof of the Latency of α-aminoketones Before Irradiation and Catalytic Activity After Irradiation)

Formula 8.(a):

200 parts of epoxy cresolnovolac (ECN1299, provided by Asahi CIBA, Japan)

50 parts of pentaerythritol tetra(mercaptoacetate) (provided by Tokyo Kasei, Japan)

The DSC curve (heating rate 10° C./min) shows a peak temperature of 199° C.

Formula 8.(b):

200 parts of epoxy cresolnovolac (ECN1299, provided by Asahi CIBA, Japan)

50 parts of pentaerythritol tetra(mercaptoacetate) (provided by Tokyo Kasei, Japan)

6 parts of 4-(methylthiobenzoyl)-1-methyl-1-morpholino ethane (®Irgacure 907, provided by Ciba Specialty Chemicals)

The DSC curve (heating rate 10° C./min) shows a peak temperature of 212° C. without exposure. After irradiating a sample for 40 s with a metal halide lamp (ORC SMX3000, 3 kW) the DSC peak shows at 167° C.

Formulation 8.(c):

200 parts of epoxyphenol novolac (GY 1180, provided by Asahi CIBA, Japan)

50 parts of pentaerythritol tetra(mercaptoacetate) (provided by Tokyo Kasei, Japan)

6 parts of (4-morpholinobenzoyl)-1-benzyl-1-dimethylaminopropane (®Irgacure 369, provided by Ciba Specialty Chemicals)

The DSC curve (heating rate 10° C./min) shows a peak temperature of 201° C. without exposure. After irradiating a sample for 40 s with a metal halide lamp (ORC SMX3000, 3 kW) the DSC peak shows at 124° C.

EXAMPLE 9

Proof That Photoimageable Thermosetting Compositions Cured by a Ionic Mechanism Can Be Obtained with the Process of the Invention The following formulations are prepared by mixing (parts by weight):

Formulation 9.(a)

200 parts of epoxy cresolnovolac (ECN1299, provided by Asahi CIBA, Japan)

50 parts of 4,4'-thiobisbenzenethiol (provided by, Sigma-Aldrich, Japan)

6 parts of (4-morpholinobenzoyl)-1-benzyl-1-dimethylaminopropane (®Irgacure 369, provided by Ciba Specialty Chemicals)

250 parts of tetrahydrofuran

Formulation 9.(b)

200 parts of epoxy cresolnovolac (ECN 1299, provided by Asahi CIBA, Japan)

50 parts of DL-dithiothreitol (provided by Tokyo Kasei, Japan)

6 parts of (4-morpholinobenzoyl)-1-benzyl-1-dimethylaminopropane (®Irgacure 369, provided by Ciba Specialty Chemicals)

250 parts of tetrahydrofuran

Formulation 9.(c)

200 parts of epoxy cresolnovolac (ECN 1299, provided by Asahi CIBA, Japan)

50 parts of pentaerythritol tetra(mercaptoacetate) (provided by Tokyo Kasei, Japan)

6 parts of (4-morpholinobenzoyl)-1-benzyl-1-dimethylaminopropane (®Irgacure 369, provided by Ciba Specialty Chemicals)

250 parts of tetrahydrofuran

Formulation 9.(d)

200 parts of epoxyphenol novolac (GY 1180, provided by Asahi CIBA, Japan)

50 parts of 4,4'-thiobisbenzenethiol (provided by Sigma-Aldrich, Japan)

6 parts of (4-morpholinobenzoyl)-1-benzyl-1-dimethylaminopropane (®Irgacure 369, provided by Ciba Specialty Chemicals)

150 parts of tetrahydrofuran

Formulation 9.(e)

200 parts of epoxyphenol novolac (BY 1180, provided by Asahi CIBA, Japan)

50 parts of 4,4'-thiobisbenzenethiol (provided by Sigma-Aldrich, Japan)

6 parts of 4-(methylthiobenzoyl)-1-methyl-1-morpholino ethane (®Irgacure 907, provided by Ciba Specialty Chemicals)

150 parts of tetrahydrofuran

Formulation 9.(f)

200 parts of an epoxyphenol novolac (GY 1180, provided by Asahi CIBA, Japan)

50 parts of DL-dithiothreitol (provided by Tokyo Kasei, Japan)

6 parts of (4-morpholinobenzoyl)-1-benzyl-1-dimethylaminopropane (®Irgacure 369, provided by Ciba Specialty Chemicals)

150 parts of tetrahydrofuran

The formulations 9.(a)–9.(f) are coated on an aluminum plate with a wire-wound bar coater (50 μm wet thickness for formulations (A–c) and 36 μm wet thickness for formulation (d–f)) and dried under air at 45° C. for 10 min. The resulting resist layers, approximately 23 μm thick and 18 μm thick for formulations (a–c) and (d–f), respectively, are tightly covered with a polyester foil, and irradiated for 320 sec with a 3 kW metal halide lamp (ORC SMX3000) which is positioned at a distance of 60 cm. The samples are irradiated through a 21 step density wedge (Stouffer Graphic Arts) and a vacuum foil at 30° C. After irradiation the samples are heated under various post-exposure bake conditions (collected in Table 2). The samples are developed by a mixture of ethanol and methylethylketone (1:1) in an ultrasonic bath. The highest tack free step was used as a measure of the resist sensitivity. The higher the number of steps, the better is the curling effectiveness of the formulation. The obtained sensitivities are listed in the following Table 2.

TABLE 2

| formulation | development time [sec] | Evaluation of stepwedge sensitivity after 320 sec of irradiation number of achieved steps post-exposure bake conditions [° C.] [min] | | | | | | | | | |
|---|---|---|---|---|---|---|---|---|---|---|---|
| | | r.t. 0 | r.t. 15 | r.t. 30 | r.t. 60 | r.t. 120 | 50 5 | 70 5 | 80 5 | 100 5 | 120 5 |
| a | 120 | 3 | 6 | 8 | 10 | 13 | 7 | 9 | nt | nt | nt |
| b | 60 | x | 4 | 8 | 10 | 13 | 6 | 11 | nt | nt | nt |
| c | 120 | x | x | x | x | x | nt | nt | x | 6 | 11 |
| d | 10 | 8 | 11 | 12 | 13 | 14 | 11 | 12 | nt | nt | nt |
| e | 10 | — | 4 | 5 | 7 | 9 | 4 | 6 | nt | 7 | nt |
| f | 10 | — | 8 | 11 | 14 | 16 | 9 | 14 | nt | nt | nt |

—: slightly polymerized,
x: no polymerization,
nt: not tested,
r.t.: 22–23° C.

What is claimed is:

1. A composition consisting essentially of (A) as latent base catalyst, at least one compound of formula I, II or III (I)

(II)

(III)

wherein $Ar_1$ is an aromatic radical of formula IV, V, VI or VII

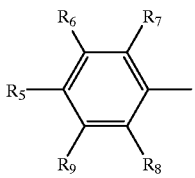

(IV)

(V)

(VI)

(VII)

X is a divalent radical of formula

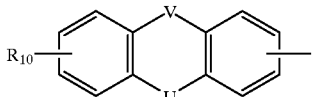

$-N(R_{11})-$ or $-N(R_{11})-R_{12}-N(R_{11})-$;

Y is $C_1-C_6$alkylene, cyclohexylene or a direct bond;
U is $-O-$, $-S-$ or $-N(R_{17})-$;

V has one of the meanings of U or is —CO—, —CH$_2$—, —CH$_2$CH$_2$—, C$_2$–C$_6$alkylidene or a direct bond;

W is unbranched or branched C$_1$–C$_7$alkylene or C$_2$–C$_6$alkylidene;

R$_1$ and R$_2$ are each independently of one another
(a) C$_1$–C$_{12}$alkyl, which is unsubstituted or substituted by OH, C$_1$–C$_4$alkoxy, SH, CN, —COO(C$_1$–C$_8$alkyl), (C$_1$–C$_4$alkyl)—COO—, phenoxy, halogen or phenyl, or are cyclopentyl or cyclohexyl
(b) a radical of formula

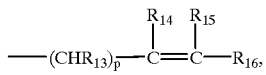

in which p is zero or 1, or
(c) a radical of formula

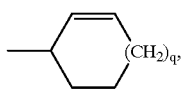

in which q is 0, 1, 2 or 3, or
(d) a radical of formula

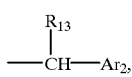

(e) phenyl which is unsubstituted or substituted by halogen, C$_1$–C$_{12}$alkyl or C$_1$–C$_{12}$alkoxy,
(f) R$_1$ and R$_2$ together are unbranched or branched C$_2$–C$_9$alkylene or C$_3$–C$_9$oxaalkylene, or form a radical of formula

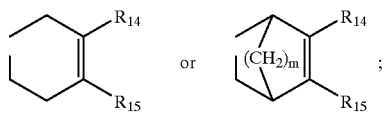

Ar$_2$ is phenyl, naphthyl, thienyl or furyl radical, each of which is unsubstituted or substituted by halogen, OH, C$_1$–C$_{12}$alkyl, or is substituted by C$_1$–C$_4$alkyl, which is substituted by OH, halogen, C$_1$–C$_{12}$alkoxy, —COO(C$_1$–C$_{18}$alkyl), —CO(OCH$_2$CH$_2$)$_n$OCH$_3$ or —OCO(C$_1$–C$_4$alkyl), or the radicals phenyl, naphthyl, thienyl or furyl are substituted by C$_1$–C$_{12}$alkoxy or by C$_1$–C$_4$alkoxy, which is substituted by —COO(C$_1$–C$_{18}$alkyl) or —CO(OCH$_2$CH$_2$)$_n$OCH$_3$, or the radicals phenyl, naphthyl, thienyl, furyl or pyridyl are substituted by —(OCH$_2$CH$_2$)$_n$OH, —(OCH$_2$CH$_2$)$_n$OCH$_3$, C$_1$–C$_8$alkylthio, phenoxy, —COO(C$_1$–C$_{18}$alkyl), —CO(OCH$_2$CH$_2$)$_n$OCH$_3$, phenyl or benzoyl;

n is 1–20;
m is 1 or 2;
R$_3$ is C$_1$–C$_{12}$alkyl, C$_2$–C$_4$alkyl which is substituted by —OH, —C$_1$–C$_4$alkoxy, —CN or —COO(C$_1$–C$_4$alkyl), or R$_3$ is C$_3$–C$_5$alkenyl, C$_5$–C$_{12}$cycloalkyl or phenyl-(C$_1$–C$_3$alkyl);
R$_4$ is C$_1$–C$_{12}$alkyl, C$_2$–C$_4$alkyl which is substituted by —OH, —C$_1$–C$_4$alkoxy, —CN or —COO(C$_1$–C$_4$alkyl), or R$_4$ is C$_3$—C$_5$alkenyl, C$_5$–C$_{12}$cycloalkyl, phenyl-C$_1$–C$_3$alkyl or phenyl which is unsubstituted or substituted by C$_1$–C$_{12}$alkyl, C$_1$–C$_4$alkoxy or —COO(C$_1$–C$_4$alkyl), or R$_4$, together with R$_2$, is C$_1$–C$_7$alkylene, phenyl-C$_1$–C$_4$alkylene, o-xylylene, 2-butenylene or C$_2$–C$_3$oxaalkylene, or R$_3$ and R$_4$ together are C$_4$–C$_7$alkylene which can be interrupted by —O—, —S— or —CO—, or R$_3$ and R$_4$ together are C$_3$–C$_7$alkylene which can be substituted by OH, C$_1$–C$_4$alkoxy or —COO(C$_1$–C$_4$)alkyl);

R$_5$, R$_6$, R$_7$, R$_8$ and R$_9$ are each independently of one another hydrogen, halogen, C$_1$–C$_{12}$alkyl, cyclopentyl, cyclohexyl, phenyl, benzyl, benzoyl or a group —OR$_{17}$, —SR$_{18}$, —SOR$_{18}$, —SO$_2$R$_{18}$, —N(R$_{20}$)(R$_{19}$), —NH—SO$_2$R$_{21}$ or

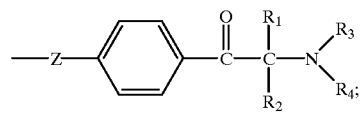

Z is —O—, —S—, —N(R$_{11}$)—, —N(R$_{11}$)—R$_{12}$—N(R$_{11}$)— or

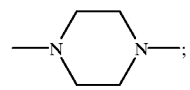

R$_{10}$ is hydrogen, C$_1$–C$_{12}$alkyl, halogen or C$_2$–C$_8$alkanoyl;
R$_{11}$ is C$_1$–C$_8$alkyl, C$_3$–C$_5$alkenyl, phenyl-C$_1$–C$_3$alkyl, C$_1$–C$_4$hydroxyalkyl or phenyl;
R$_{12}$ is unbranched or branched C$_2$–C$_{16}$alkylene, which can be interrupted by one or more —O— or —S—;
R$_{13}$ is hydrogen, C$_1$–C$_8$alkyl or phenyl;
R$_{14}$, R$_{15}$ and R$_{16}$ are each independently of one another hydrogen or C$_1$–C$_4$alkyl, or C$_{14}$ and R$_{15}$ together are C$_3$–C$_7$alkylene;
R$_{17}$ is hydrogen, C$_1$–C$_{12}$alkyl, C$_2$–C$_5$alkyl which is substituted by —SH, —CN, —OH, C$_1$–C$_4$alkoxy, C$_3$–C$_6$alkenoxy, —OCH$_2$CH$_2$CN, —OCH$_2$CH$_2$COO(C$_1$–C$_4$alkyl), —COOH or —O—CO—C$_1$–C$_4$alkyl which is unsubstituted or substituted by SH, or R$_{17}$ is —COO(C$_1$–C$_4$alkyl), or R$_{17}$ is C$_1$–C$_6$alkyl which is interrupted by one or more —O—, or R$_{17}$ is —(CH$_2$CH$_2$O)$_n$H, C$_2$–C$_8$alkanoyl, C$_3$–C$_{12}$alkenyl, cyclohexyl, hydroxycyclohexyl, phenyl which is unsubstituted or substituted by halogen, C$_1$–C$_{12}$alkyl or C$_1$–C$_4$alkoxy, or R$_{17}$ is phenyl-C$_1$–C$_3$alkyl or —Si(C$_1$–C$_8$alkyl)$_r$(phenyl)$_{3-r}$;
r is 1, 2 or 3;
R$_{18}$ is hydrogen, C$_1$–C$_{12}$alkyl, C$_3$–C$_{12}$alkenyl, cyclohexyl, C$_2$–C$_{12}$alkyl which is substituted by —SH, —OH, —CN, —COOH, —COO(C$_1$–C$_4$alkyl), C$_1$–C$_4$alkoxy, —OCH$_2$CH$_2$CN or —O—CO—C$_1$–C$_4$alkyl which is unsubstituted or substituted by SH or R$_{18}$ is —OCH$_2$CH$_2$COO(C$_1$–C$_4$alkyl), or R$_{18}$ is C$_1$–C$_{12}$alkyl which is interrupted by —S— or —O—, or R$_{18}$ is phenyl which is unsubstituted or substituted by halogen, SH, C$_1$–C$_{12}$alkyl or C$_1$–C$_4$alkoxy, or R$_{18}$ is phenyl-C$_1$–C$_3$alkyl;
R$_{19}$ and R$_{20}$ are each independently of the other, C$_1$–C$_{12}$alkyl, C$_2$–C$_4$hydroxyalkyl, $C_2$–$C_{10}$alkoxyalkyl, $C_3$–$C_5$alkenyl, $C_5$–$C_{12}$cycloalkyl, phenyl-$C_1$–$C_3$alkyl, phenyl which is unsubstituted or substituted by halogen, $C_1$–$C_{12}$alkyl or $C_1$–$C_4$alkoxy, or $R_{19}$ and $R_{20}$ are $C_2$–$C_3$alkanoyl or benzoyl, or $R_{19}$ and $R_{20}$ together are $C_2$–$C_8$alkylene which can be interrupted by —O— or —S—, or $R_{19}$ and $R_{20}$ together are $C_2$–$C_8$alkylene which can be substituted by hydroxyl, $C_1$–$C_4$alkoxy or —COO($C_1$–$C_4$alkyl); and or —COO($C_1$–$C_4$alkyl); and $R_{21}$ is $C_1$–$C_{18}$alkyl, phenyl which is unsubstituted or substituted by halogen, $C_1$–$C_{12}$alkyl or $C_1$–$C_8$alkoxy, or $R_{21}$ is naphthyl;

(B) a mixture of at least one epoxide compound and at least one compound which is capable of reacting with epoxides in the presence of a base; and (C) optionally, a sensitizer.

2. A composition according to claim 1, wherein the compound capable of reacting with epoxides in the presence of a base is a carboxylic compound or a thiol.

3. A composition according to claim 1, wherein component (A) is a compound of formula I wherein $Ar_1$ is a group of formula IV, wherein $R_5$ is a group —$OR_{17}$, —$SR_{18}$, —$N(R_{19})(R_{20})$ or

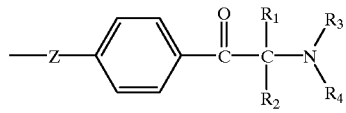

$R_6$ is hydrogen, halogen or $C_1$–$C_4$alkyl or has one of the meanings given for $R_5$, $R_7$ and $R_8$ are hydrogen or halogen, $R_9$ is hydrogen or $C_1$–$C_4$alkyl, Z is —O—, —S— or —$N(R_{11})$—, $R_1$ and $R_2$ each independently of the other are either
(a) $C_1$–$C_6$alkyl,
(b) a radical of formula

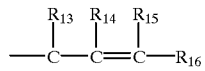

(d) a radical of formula —$CH(R_{13})$—$Ar_2$; in which
$Ar_2$ is a phenyl radical which is unsubstituted or substituted by halogen, $C_1$–$C_4$alkyl methylthio, methoxy or benzoyl;
$R_3$ and $R_4$ are each independently of the other $C_1$–$C_{12}$alkyl, $C_2$–$C_4$alkyl which is substituted by $C_1$–$C_4$alkoxy, —CN or —COO($C_1$–$C_4$alkyl), or $R_3$ and $R_4$ are allyl, cyclohexyl or benzyl, or $R_3$ and $R_4$ together are $C_4$–$C_6$alkylene which can be interrupted by —O—;
$R_{11}$ is $C_1$–$C_4$alkyl, allyl, benzyl or $C_2$–$C_4$alkanoyl;
$R_{12}$ is $C_2$–$C_6$alkylene;
$R_{13}$, $R_{14}$, $R_{15}$ and $R_{16}$ are each independently of one another hydrogen or methyl;
$R_{17}$ is unsubstituted or SH-substituted $C_1$–$C_4$alkyl, 2-hydroxyethyl, 2-methoxyethyl, 2-allyloxyethyl, allyl, cyclohexyl, phenyl, benzyl or —$Si(CH_3)_3$;
$R_{18}$ is hydrogen, unsubstituted or SH-substituted $C_1$–$C_{12}$alkyl, 2-hydroxyethyl, 2-methoxyethyl, unsubstituted or SH-substituted phenyl, or is p-tolyl or benzyl; and
$R_{19}$ and $R_{20}$ are each independently of the other $C_1$–$C_{12}$alkyl, $C_2$–$C_8$alkoxyalkyl, acetyl, allyl or benzyl, or $R_{20}$ and $R_{21}$ together are $C_4$–$C_6$alkylene which can be interrupted by —O—.

4. A composition according to claim 1, wherein component (A) is a compound of formula I, wherein $Ar_1$ is a group of formula IV, wherein $R_5$ is a group —$OR_{17}$, —$SR_{18}$, —$N(R_{19})(R_{20})$, $R_6$ is hydrogen, halogen or $C_1$–$C_4$alkyl or has one of the meanings given for $R_5$, $R_7$ and $R_8$ are hydrogen or chloro, $R_9$ is hydrogen or $C_1$–$C_4$alkyl, $R_1$ is either
(a) a radical of formula

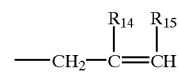

(b) a radical of formula —$CH_3$—$Ar_2$, in which
$Ar_2$ is a phenyl radical which is unsubstituted or substituted by halogen, $C_1$–$C_4$alkyl, $CH_2S$—, $CH_3O$— or benzoyl;
$R_2$ has one of the meanings given for $R_1$ or is $C_1$–$C_4$alkyl,
$R_3$ and $R_4$ are each independently of the other $C_1$–$C_6$alkyl, 2-methoxyethyl, allyl or benzyl, or $R_3$ and $R_4$ together are tetramethylene, pentamethylene or 3-oxapentamethylene,
$R_{14}$ and $R_{15}$ are hydrogen or methyl,
$R_{17}$ is unsubstituted or SH-substituted $C_1$–$C_4$alkyl, 2-hydroxyethyl, 2-methoxyethyl or phenyl,
$R_{18}$ is unsubstituted or SH-substituted $C_1$–$C_{12}$alkyl, 2-hydroxyethyl, 2-methoxyethyl, unsubstituted or SH-substituted phenyl or is p-tolyl, and $R_{19}$ and $R_{20}$ are hydrogen, $C_1$–$C_4$alkyl, 2-methoxyethyl, acetyl or allyl, or $R_{19}$ and $R_{20}$ together are $C_4$–$C_5$-alkylene which can be interrupted by —O—.

5. A composition according to claim 1, wherein component (A) is a compound of formula I, wherein $Ar_1$ is a group of formula IV, wherein $R_1$ and $R_2$ each independently of the other are $C_1$–$C_4$alkyl or benzyl;

$R_3$ and $R_4$ each independently of the other are $C_1$–$C_4$alkyl or together are morpholino;

$R_5$ is morpholino or $C_1$–$C_4$alkylthio; and $R_6$, $R_7$, $R_8$ and $R_9$ are hydrogen.

6. A process for photochemically generating bases in base-catalysed polymerization reactions, characterized in that a compound of formula I, II or III as defined in claim 1, is added as a latent base to the mixture to be polymerized and irradiated with light of the wavelength from 200 to 700 nm to generate the base.

7. A process according to claim 6, wherein in addition to the latent base a triplet energy sensitizer selected from the group of carbonyl compounds having a triplet energy of 225–310 kJ/mol is added.

* * * * *